US010211331B2

(12) United States Patent
Ichijo et al.

(10) Patent No.: US 10,211,331 B2
(45) Date of Patent: Feb. 19, 2019

(54) SEMICONDUCTOR DEVICE

(71) Applicant: KABUSHIKI KAISHA TOSHIBA, Tokyo (JP)

(72) Inventors: Hisao Ichijo, Kanazawa Ishikawa (JP); Syotaro Ono, Kanazawa Ishikawa (JP); Masahiro Shimura, Hakusan Ishikawa (JP); Hideyuki Ura, Nonoichi Ishikawa (JP); Hiroaki Yamashita, Hakusan Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,095

(22) Filed: Aug. 30, 2016

(65) Prior Publication Data

US 2017/0263747 A1 Sep. 14, 2017

(30) Foreign Application Priority Data

Mar. 11, 2016 (JP) .................................. 2016-048840

(51) Int. Cl.
*H01L 29/739* (2006.01)
*H01L 29/78* (2006.01)
(Continued)

(52) U.S. Cl.
CPC ...... *H01L 29/7803* (2013.01); *H01L 27/0629* (2013.01); *H01L 27/0688* (2013.01);
(Continued)

(58) Field of Classification Search
None
See application file for complete search history.

(56) References Cited

U.S. PATENT DOCUMENTS 8,816,410 B2 8/2014 Saito et al.
9,362,393 B2 6/2016 Sakata et al.
(Continued)

FOREIGN PATENT DOCUMENTS

JP H05167070 A 7/1993
JP H07211899 A 8/1995
(Continued)

OTHER PUBLICATIONS

Japanese Office Action dated May 18, 2018, filed in Japanese counterpart Application No. 2016-048840, 23 pages (with translation).

*Primary Examiner* — Ali Naraghi
(74) *Attorney, Agent, or Firm* — Kim & Stewart LLP

(57) ABSTRACT

A semiconductor device includes a first conductivity type first semiconductor region, a second conductivity type second semiconductor region, a second conductivity type third semiconductor region, a first conductivity type fourth semiconductor region, a gate insulating portion, a gate electrode, and first and second electrodes. The first semiconductor region includes first and second portions. The second semiconductor region includes third and fourth portions. The gate electrode is on the gate insulating portion and over the first semiconductor region and a portion of the third semiconductor region. The first electrode is on, and electrically connected to, the fourth semiconductor region. The second electrode is over the first portion, the third portion, and the gate electrode, and spaced from the first electrode.

18 Claims, 36 Drawing Sheets

(51) Int. Cl.
   *H01L 29/06*   (2006.01)
   *H01L 27/06*   (2006.01)
   *H01L 49/02*   (2006.01)

(52) U.S. Cl.
   CPC ...... *H01L 29/0623* (2013.01); *H01L 29/0696* (2013.01); *H01L 28/20* (2013.01); *H01L 28/40* (2013.01)

(56) References Cited

U.S. PATENT DOCUMENTS

| | | |
|---|---|---|
| 9,620,595 B2 | 4/2017 | Shimatou |
| 2010/0308399 A1* | 12/2010 | Saito .................. H01L 29/0634 257/329 |

FOREIGN PATENT DOCUMENTS

| | | |
|---|---|---|
| JP | 2009105177 A | 5/2009 |
| JP | 2011049424 A | 3/2011 |
| JP | 2012156333 A | 8/2012 |
| JP | 2013-251513 A | 12/2013 |
| JP | 5665567 B2 | 2/2015 |
| JP | 2015213141 A | 11/2015 |
| JP | WO2015107742 A1 | 3/2017 |

\* cited by examiner

SEMICONDUCTOR DEVICE

CROSS-REFERENCE TO RELATED APPLICATION

This application is based upon and claims the benefit of priority from Japanese Patent Application No. 2016-048840, filed Mar. 11, 2016, the entire contents of which are incorporated herein by reference.

FIELD

Embodiments described herein relate generally to a semiconductor device.

BACKGROUND

A semiconductor device such as a MOSFET (Metal Oxide Semiconductor Field Effect Transistor) is used for power conversion and the like. It is desirable to reduce noise generated when the semiconductor device is switched.

DETAILED DESCRIPTION

In general, according to one embodiment, a semiconductor device includes a first conductivity type first semiconductor region including a first portion and a second portion adjacent to the first portion in a first direction, a second conductivity type second semiconductor region including a third portion adjacent to the first portion in a second direction that intersects the first direction and a fourth portion disposed adjacent to the second portion in the second direction, a second conductivity type third semiconductor region on the second semiconductor region, a first conductivity type fourth semiconductor region on the third semiconductor region, a gate insulating portion on the first semiconductor region and on the third semiconductor region, a gate electrode on the gate insulating portion, and over the first semiconductor region and a portion of the third semiconductor region, a first electrode on, and electrically connected to, the fourth semiconductor region and spaced from the gate electrode, and a second electrode over the first portion, the third portion, and the gate electrode, and spaced from the first electrode.

In the following, embodiments of the invention will be described with reference to the drawings.

Further, the drawings are drawn schematically and conceptually, a relation between thickness and width of each component and a ratio between sizes of the components are not necessarily exactly the same as in an actual device.

In addition, the dimensions and ratios of the same component may be differently illustrated from each other depending on the drawings. In addition, elements in the specification and the drawings having the same reference numbers and symbols which were already described, the descriptions thereof will be omitted as appropriate.

The XYZ orthogonal coordinate system is used in the descriptions of the respective embodiments. A direction from a drain electrode 31 to a source electrode 32 is set to a Z direction, and two directions perpendicular to the Z direction and orthogonal to each other are set to an X direction (the second direction) and a Y direction (the first direction).

In the following description, the denotation of $n^+$, $n$, $n^-$, $p$, and $p^-$ indicates a relative magnitude of an impurity concentration in each conductive type. In other words, a type attached with the denotation of "+" means that the type has an impurity concentration relatively higher than that of other types not having any other denotations such as "+" and "−". A type attached with the denotation of "−" means that the type has an impurity concentration relatively lower than that of other types having no denotation.

The embodiments may be implemented while reversing the p type and the n type of each of the semiconductor region in the following description.

First Embodiment

Figure 1A:
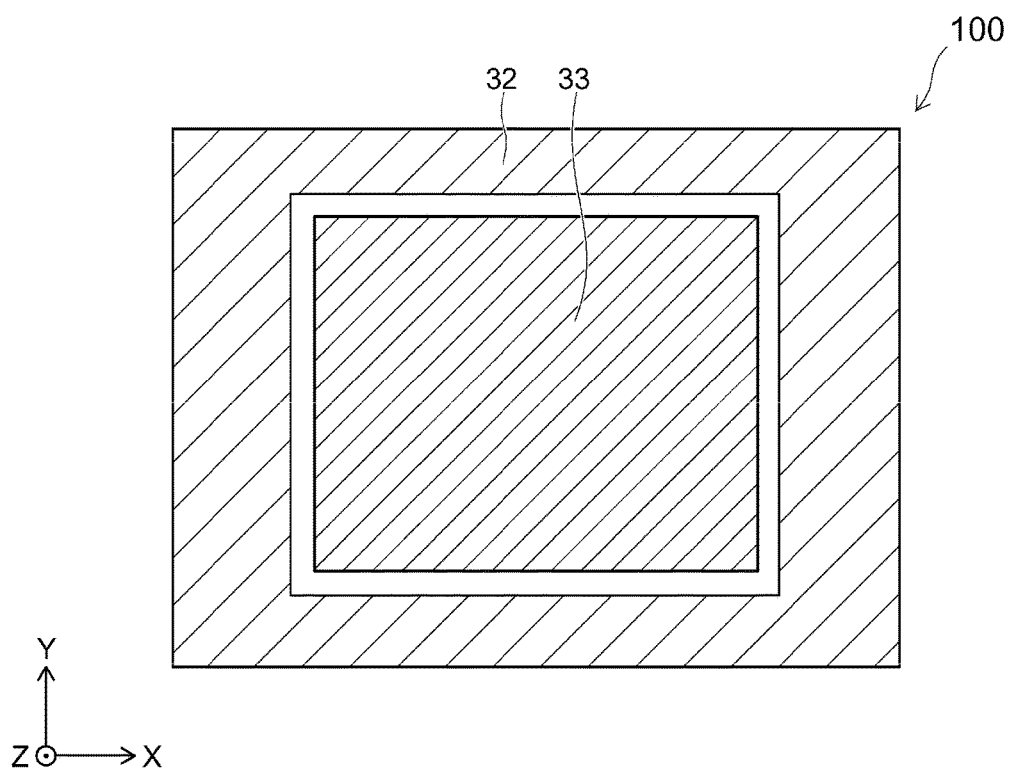
FIGS. 1A and 1B are plan views illustrating a part of a semiconductor device according to a first embodiment.
Figure 1B:
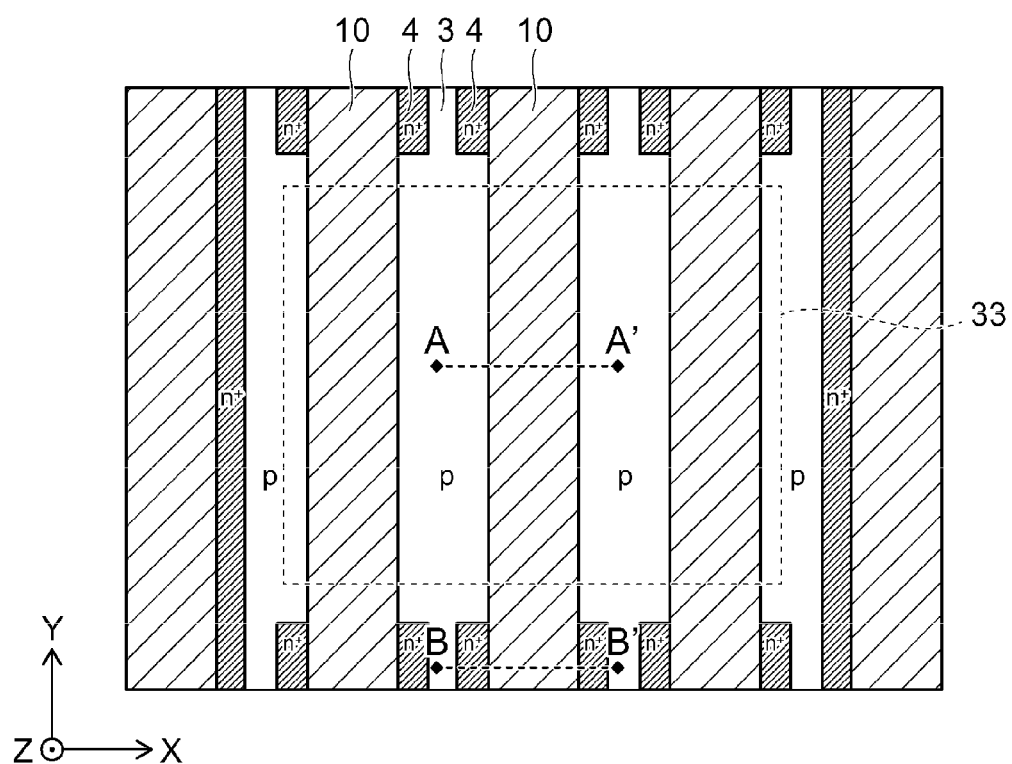

An example of a semiconductor device according to a first embodiment will be described using FIGS. 1A to 2B. FIGS. 1A and 1B are plan views illustrating a part of a semiconductor device 100 according to the first embodiment.

Figure 2A:
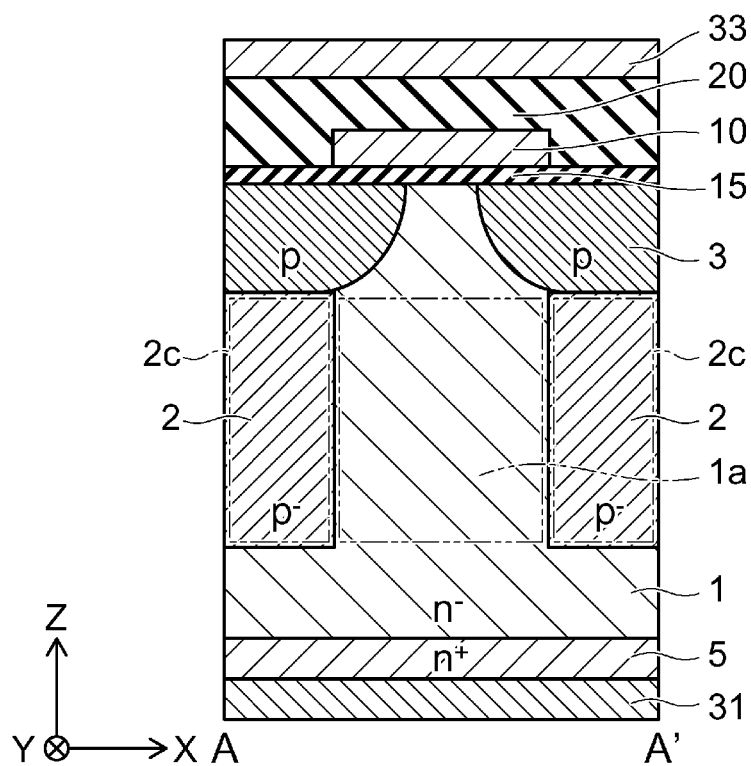
FIG. 2A is a cross-sectional view taken along a line A-A' of FIG. 1B.
Figure 2B:
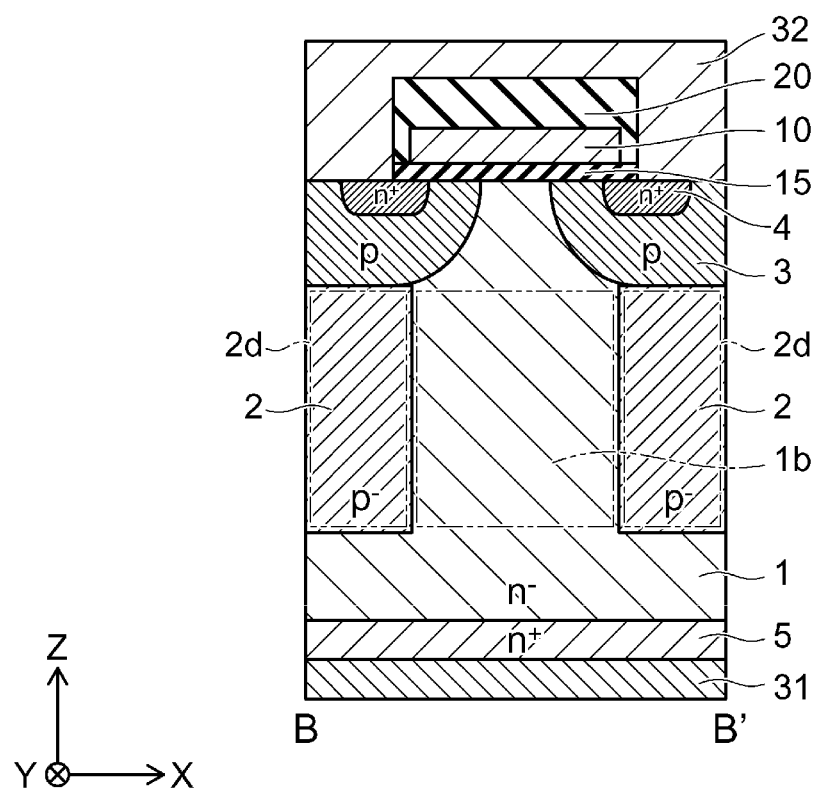
FIG. 2B is a cross-sectional view taken along a line B-B' of FIG. 1B.

FIG. 2A is a cross-sectional view taken along a line A-A' of FIG. 1B, and FIG. 2B is a cross-sectional view taken along a line B-B' of FIG. 1B.

In the depiction of the device of FIG. 1B, an insulating portion 20 and a source electrode 32 are omitted, and a gate pad 33 is depicted using a broken line.

The semiconductor device 100 is a MOSFET.

As illustrated in FIGS. 1A to 2B, the semiconductor device 100 includes an $n^-$ type (the first conductive type) semiconductor region 1 (the first semiconductor region), a $p^-$ type (the second conductive type) pillar region 2 (the second semiconductor region), a p type base region 3 (the third semiconductor region), an $n^+$ type source region 4 (the fourth semiconductor region), an $n^+$ type drain region 5, a gate electrode 10, a gate insulating portion 15, an insulating portion 20 (a first insulating portion), a drain electrode 31, a source electrode 32 (the first electrode), and a gate pad 33 (the second electrode).

As illustrated in FIG. 1A, the source electrode 32 and the gate pad 33 are provided on the upper surface of the semiconductor device 100 and spaced from each other.

As illustrated in FIG. 1B, a plurality of gate electrodes 10 are provided spaced in the X direction and extending in the Y direction below the source electrode 32 and the gate pad 33.

As illustrated in FIGS. 2A and 2B, the drain electrode 31 is provided on the lower surface of the semiconductor device 100.

The $n^+$ type drain region 5 is provided on the drain electrode 31, and electrically connected to the drain electrode 31.

The $n^-$ type semiconductor region 1 is provided on the $n^+$ type drain region 5.

The $p^-$ type pillar region 2 is provided in the $n^-$ type semiconductor region 1.

A plurality of $p^-$ type pillar regions 2 are provided spaced apart in the X direction, and they each extend in the Y direction.

Portions of the $n^-$ type semiconductor region 1 and the $p^-$ type pillar region 2 are alternately provided in the X direction, and where they adjoin they form a super junction structure (hereinafter, referred to as "SJ structure").

The $n^-$ type semiconductor region 1 includes a first portion 1a located below the gate pad 33 and a second portion 1b located below the source electrode 32.

Similarly, the $p^-$ type pillar region 2 includes a third portion 2c located below the gate pad 33 and a fourth portion 2d located below the source electrode 32.

The first portion 1a is disposed side by side with the second portions 1b in the Y direction, and disposed side by side with the third portion 2c in the X direction.

In addition, the fourth portion 2d is disposed side by side with the third portions 2c in the Y direction, and disposed side by side with the second portion 1b in the X direction.

The p type base region 3 is provided on the p type pillar region 2 (2c and 2d).

The $n^+$ type source region 4 is selectively provided on the p type base region 3 above pillar regions 2c.

As illustrated in FIG. 1B, a plurality of p type base regions 3 and a plurality of $n^+$ type source regions 4 are provided spaced apart in the X direction and they extend in the Y direction.

As illustrated in FIGS. 2A and 2B, the gate electrode 10 is provided on the $n^-$ type semiconductor region 1 and the p type base region 3 with the gate insulating portion 15 extending therebetween.

The source electrode 32 is provided on the $n^+$ type source region 4, and is electrically connected to the $n^+$ type source region 4.

The insulating portion 20 is provided between the source electrode 32 and the gate electrode 10, and the electrodes thereof are electrically isolated from each other.

The gate pad 33 is provided on the insulating portion 20 over the gate electrode 10. In addition, the gate pad 33 is electrically connected to the gate electrode 10.

Further, the gate pad 33 may be provided directly on the gate electrode 10 without an intervening insulating portion 20.

Herein, operation of the semiconductor device 100 will be described.

When a voltage equal to or more than a threshold value is applied to the gate electrode 10 in a state where a positive voltage is applied to the drain electrode 31 with respect to the source electrode 32, the semiconductor device enters an ON state. When this occurs, a channel (reverse layer) is formed in the p type base region 3 in the vicinity of the gate insulating portion 15.

Thereafter, when the voltage applied to the gate electrode 10 becomes less than the threshold value, the channel of the p type base region 3 disappears, and the semiconductor device is switched from the ON state to an OFF state.

When the semiconductor device is in the OFF state, and a positive potential is applied to the drain electrode 31 with respect to the potential of the source electrode 32, a depletion layer is widened from the pn junction surface between the $n^-$ type semiconductor region 1 and the $p^-$ type pillar region 2 into the $n^-$ type semiconductor region 1 and the $p^-$ type pillar region 2. Since the depletion layer is widened from the pn junction surface between the $n^-$ type semiconductor region 1 and the $p^-$ type pillar region 2, the breakdown voltage of the semiconductor device can be increased.

Next, exemplary materials of the respective components will be described.

The $n^-$ type semiconductor region 1, the $p^-$ type pillar region 2, the p type base region 3, the $n^+$ type source region 4, and the $n^+$ type drain region 5 contain silicon, silicon carbide, gallium nitride, or gallium arsenide as a semiconductor material. In a case where silicon is used as the semiconductor material, arsenic, phosphorus, or antimony may be used as an n type impurity. Boron may be used as a p type impurity.

The gate electrode 10 contains a conductive material such as polysilicon, i.e., doped polysilicon.

The gate insulating portion 15 and the insulating portion 20 contain an insulating material such as silicon oxide.

The drain electrode 31, the source electrode 32, and the gate pad 33 contain metal such as aluminum.

A description of an example of a method of manufacturing the semiconductor device 100 according to the first embodiment follows.

FIGS. 3A to 4B are cross-sectional views illustrating the results of manufacturing steps of the method of manufacturing the semiconductor device 100 according to the first embodiment.

Further, the drawings on the left side in FIGS. 3A to 4B are cross-sectional views illustrating the results a position taken along a line A-A' of FIG. 1B, and the drawings on the right side are cross-sectional views illustrating the results at a position taken along a line B-B' of FIG. 1B.

Figure 3A:
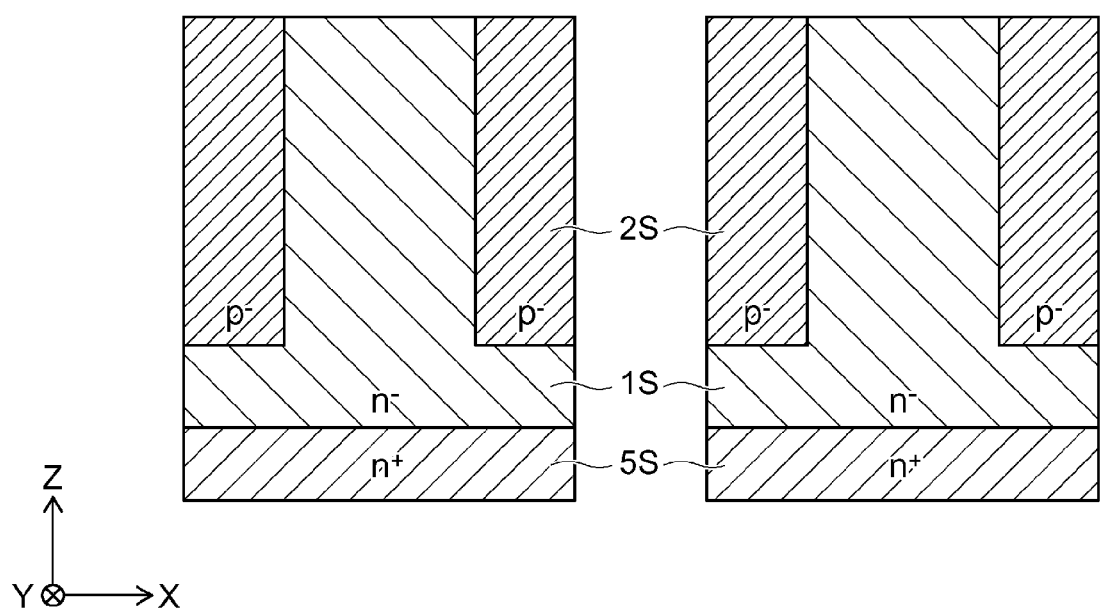
FIGS. 3A and 3B are cross-sectional views illustrating a manufacturing procedure of the semiconductor device according to the first embodiment.

First, a semiconductor substrate is prepared which includes an n$^+$ type semiconductor layer 5S and an n$^-$ type semiconductor layer 1S. Next, a plurality of trenches extending in the Y direction are formed into the surface of the n$^-$ type semiconductor layer 1S. Subsequently, a p$^-$ type semiconductor layer 2S is formed on the n$^-$ type semiconductor layer 1S. As illustrated in FIG. 3A, the trenches are filled with the p$^-$ type semiconductor layer 2S.

Figure 3B:
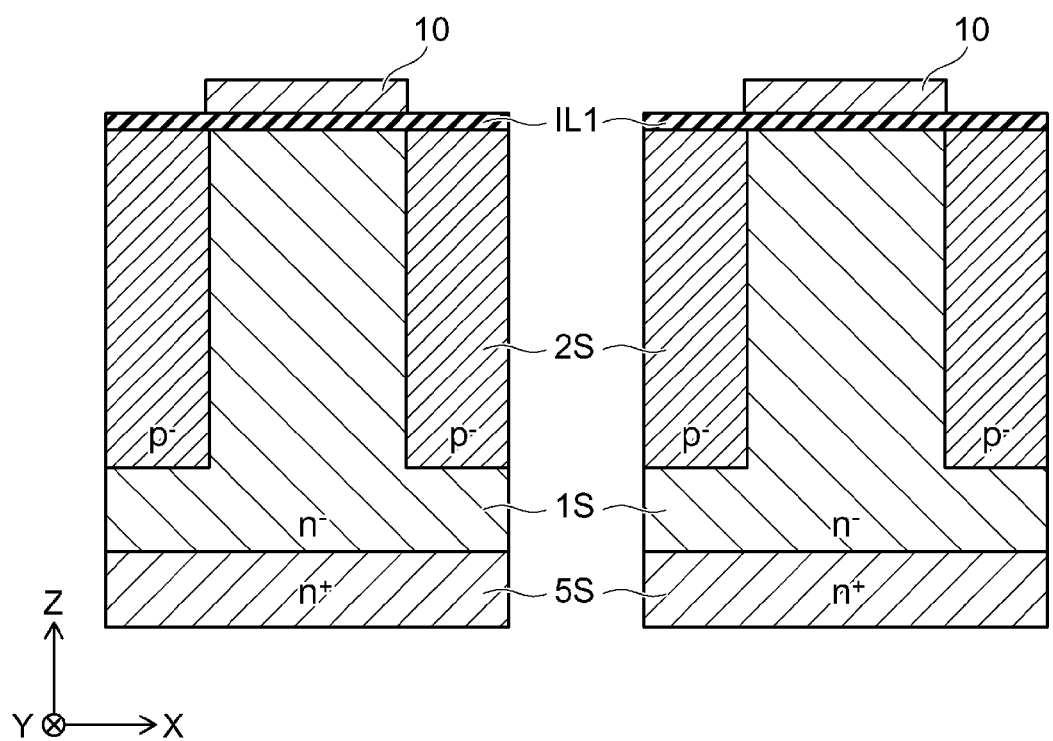

Next, an insulating layer IL1 is formed on the surfaces of the n$^-$ type semiconductor layer 1S and the p$^-$ type semiconductor layer 2S by thermally oxidizing these surfaces. Subsequently, a conductive layer is formed on the insulating layer IL1. As illustrated in FIG. 3B, the gate electrode 10 is formed by patterning the conductive layer.

Figure 4A:
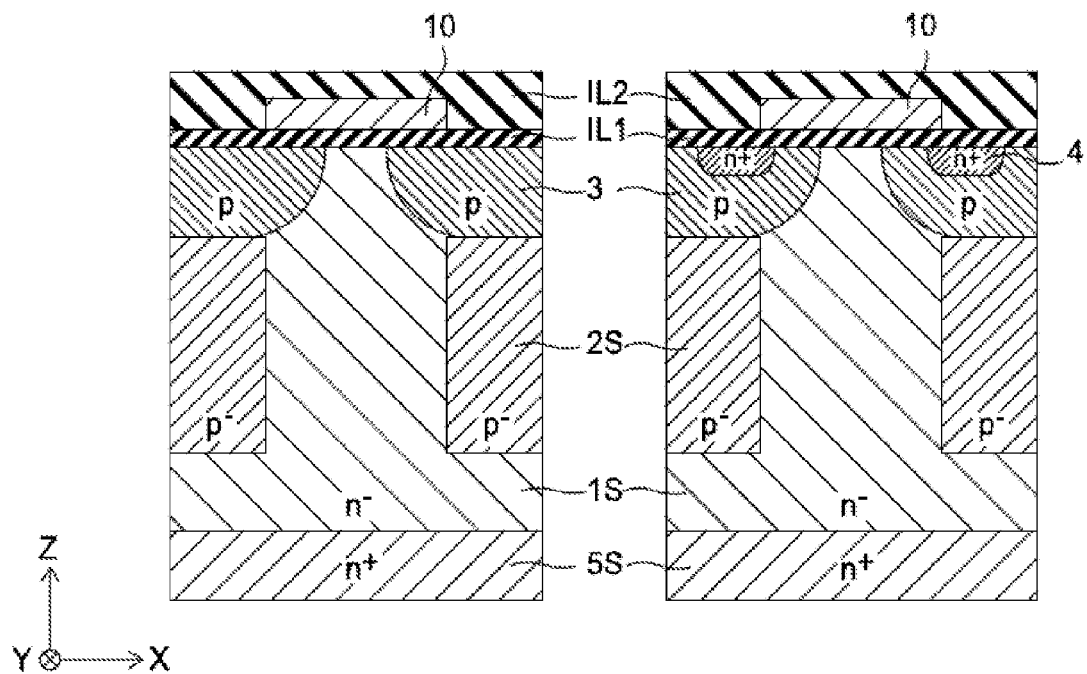
FIGS. 4A and 4B are cross-sectional views illustrating a manufacturing procedure of the semiconductor device according to the first embodiment.

Next, the p type impurities are ion-implanted into the surface of the p$^-$ type semiconductor layer 2S to form the p type base region 3. Subsequently, the n type impurities are selectively ion-implanted into the surface of the p type base region 3 to form the n$^+$ type source region 4. Subsequently, an insulating layer IL2 is formed to cover the gate electrode 10 as illustrated in FIG. 4A.

Figure 4B:
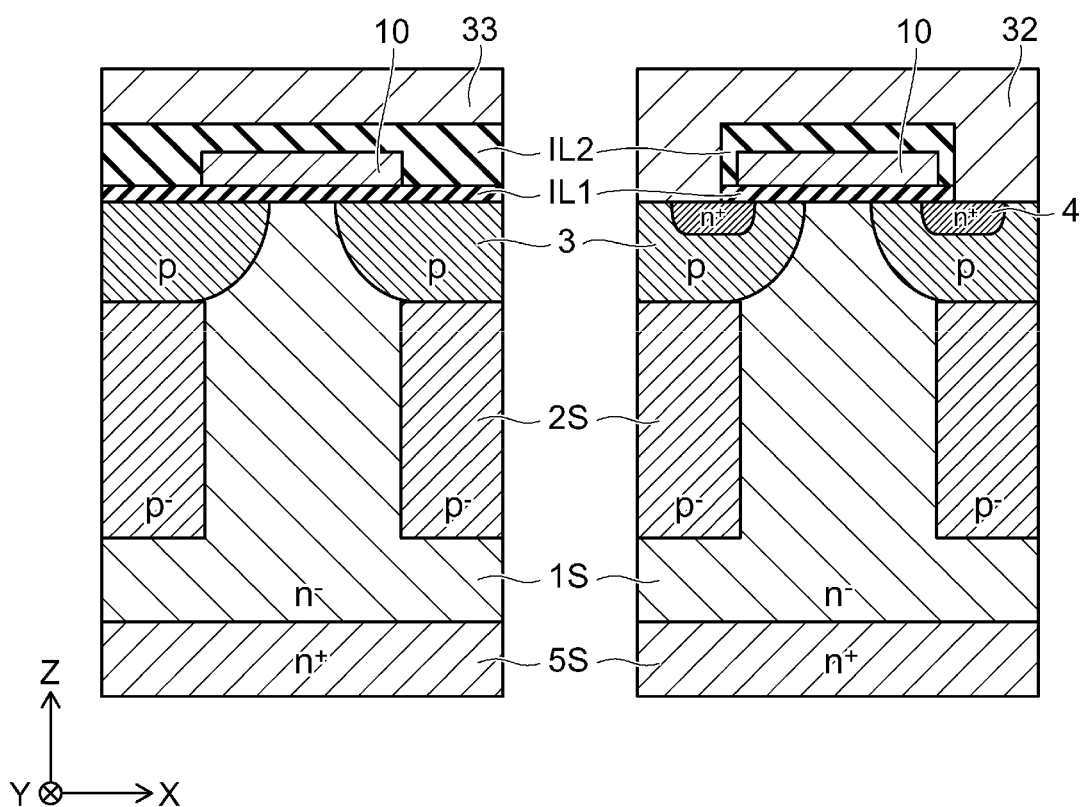

Next, the insulating layers IL1 and IL2 are patterned to expose a part of the p type base region 3 and the n$^+$ type source region 4. Subsequently, a metal layer is formed to cover the insulating layers IL1 and IL2. The source electrode 32 and the gate pad 33 are formed by patterning the metal layer as illustrated in FIG. 4B.

Next, the rear surface of the n$^+$ type semiconductor layer 5S is ground until the n$^+$ type semiconductor layer 5S has a predetermined thickness. Thereafter, the drain electrode 31 is formed in the rear surface of the n$^+$ type semiconductor layer 5S and the semiconductor device 100 illustrated in FIGS. 1A to 2B is obtained.

Next, the inherent resistance components and capacitance components contained in the semiconductor device according to this embodiment will be described using FIGS. 5 to 8.

Figure 5:
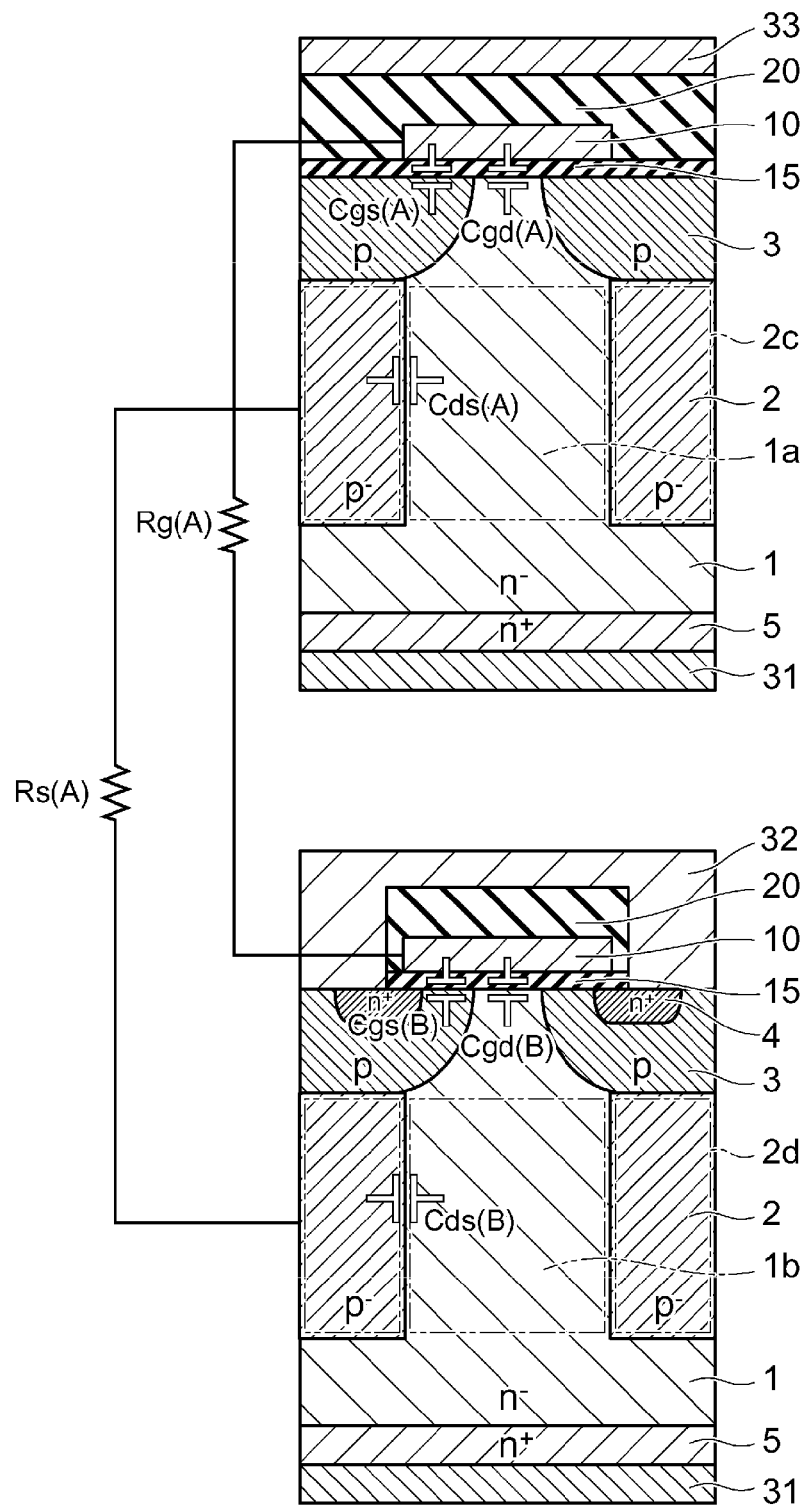
FIG. 5 is a diagram schematically illustrating a resistance component and a capacitance component in the cross-sectional views illustrated in FIGS. 2A and 2B.

FIG. 5 is a diagram schematically illustrating the inherent resistance components and capacitance components in the cross-sectional views illustrated in FIGS. 2A and 2B.

Figure 6:
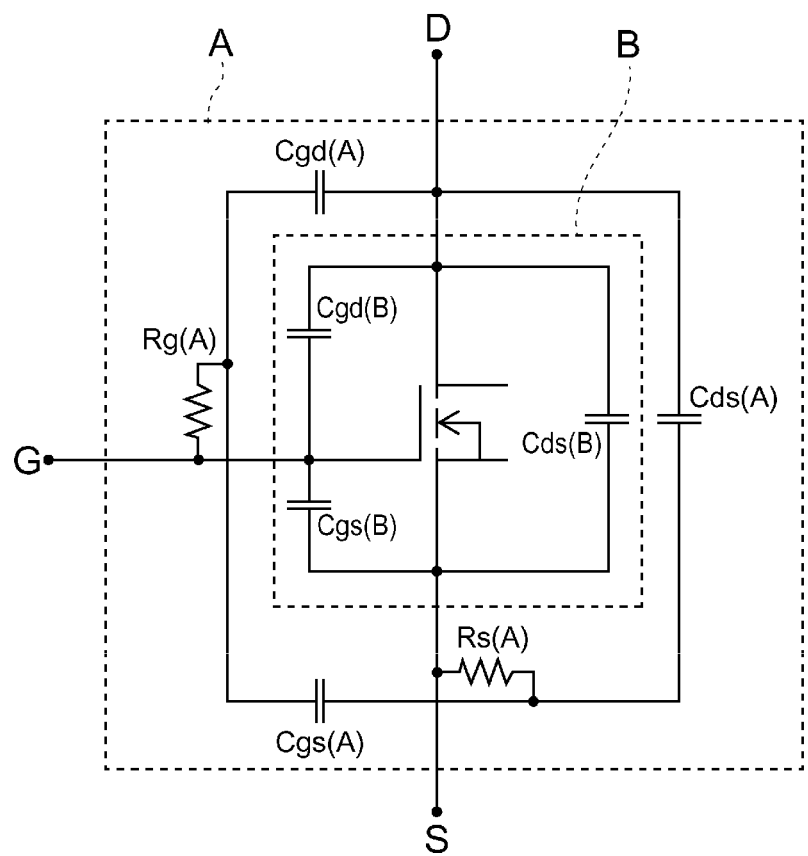
FIG. 6 is an equivalent circuit diagram of the semiconductor device according to the first embodiment.
Figure 7:
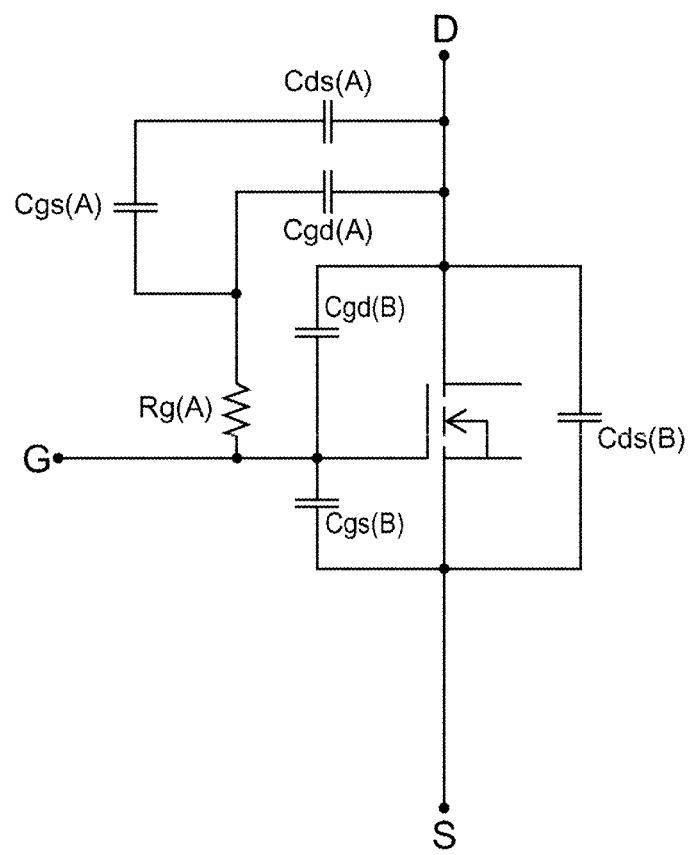
FIG. 7 is an equivalent circuit diagram of the semiconductor device according to the first embodiment.
Figure 8:
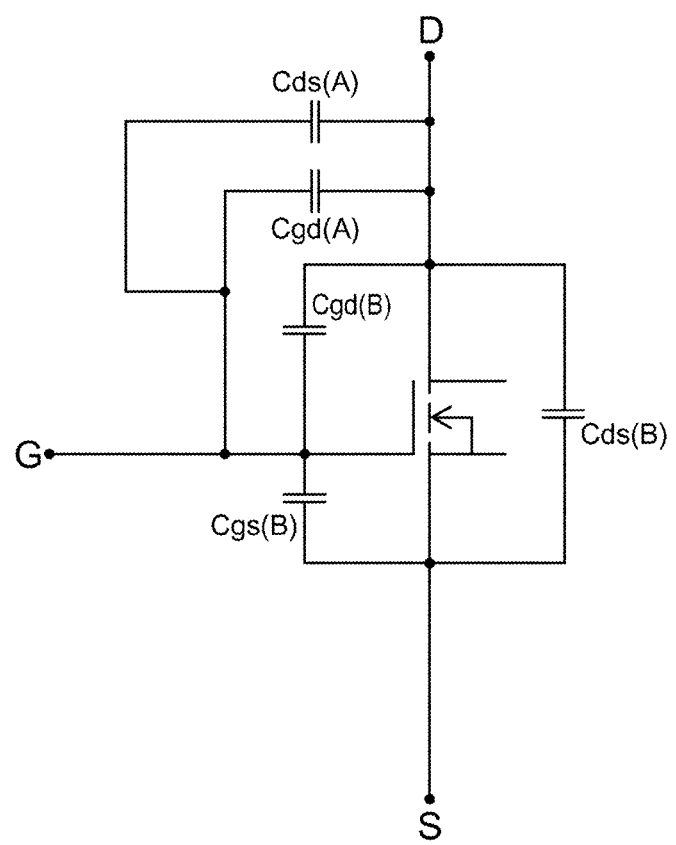
FIG. 8 is an equivalent circuit diagram of the semiconductor device according to the first embodiment.

FIGS. 6 to 8 are equivalent circuit diagrams of the semiconductor device 100 according to the first embodiment.

As illustrated in FIG. 5, the semiconductor device 100 has a capacitance Cds(A) between the first portion 1a and the third portion 2c, a capacitance Cgd(A) between the n$^-$ type semiconductor region 1 and the gate electrode 10, and a capacitance Cgs(A) between the p type base region 3 and the gate electrode 10 in a region A below the gate pad 33.

In a region B below the source electrode 32, the semiconductor device 100 has a capacitance Cds(B) between the second portion 1b and the fourth portion 2d, a capacitance Cgd(B) between the n$^-$ type semiconductor region 1 and the gate electrode 10, and a capacitance Cgs(B) between the p type base region 3 and the gate electrode 10.

In addition, a resistance between the third portion 2c and the fourth portion 2d is denoted as Rs(A), and a resistance between a portion below the gate pad 33 of the gate electrode 10 and a portion below the source electrode 32 is denoted by Rg(A).

FIG. 6 is a circuit diagram in which these components are denoted.

In the region B below the source electrode 32, the capacitance Cgd(B) between a gate potential G and a drain potential D, the capacitance Cgs(B) between the gate potential G and a source potential S, and the capacitance Cds(B) between the drain potential D and the source potential S are present.

In the region A below the gate pad 33, the capacitance Cgd(A) between the gate potential G and the drain potential D, the capacitance Cgs(A) between the gate potential G and the source potential S, and the capacitance Cds(A) between the drain potential D and the source potential S are present.

The resistance Rs(A) and the resistance Rg(A) are connected in parallel between the capacitances contained in the region A and the capacitances contained in the region B.

Herein, a state when the semiconductor device is transitioned from the ON state to the OFF state (turn off) will be described. When the semiconductor device is turned off, the depletion layer extends into the n$^-$ type semiconductor region 1 and the p$^-$ type pillar region 2 as described above. As a result of depletion in the p$^-$ type pillar region 2, the resistance Rs(A) of the p$^-$ type pillar region 2 is significantly increased between the third portion 2c and the fourth portion 2d.

The respective components contained in the semiconductor device 100 under these conditions are illustrated as an equivalent circuit in FIG. 7.

In the circuit illustrated in FIG. 7, since the gate electrode 10 has high conductivity and continuously extends in the Y direction, the resistance Rg(A) in the gate electrode 10 is small.

In addition, comparing the capacitance Cgs(A) and the capacitance Cds(A), the capacitance Cgs(A) is significantly larger than the capacitance Cds(A).

Therefore, the resistance Rg(A) and the capacitance Cgs (A) are ignored in the equivalent circuit illustrated in FIG. 7, the respective components contained in the semiconductor device 100 are illustrated as an equivalent circuit in FIG. 8.

In other words, when the semiconductor device is turned off, as illustrated in FIG. 8, the capacitances Cgd(B), Cgd (A), and Cds(A) can be considered as being connected in parallel between the gate potential G and the drain potential D.

Herein, the operation and the effect of this embodiment will be described using FIGS. 9A to 10.

Figure 9A:
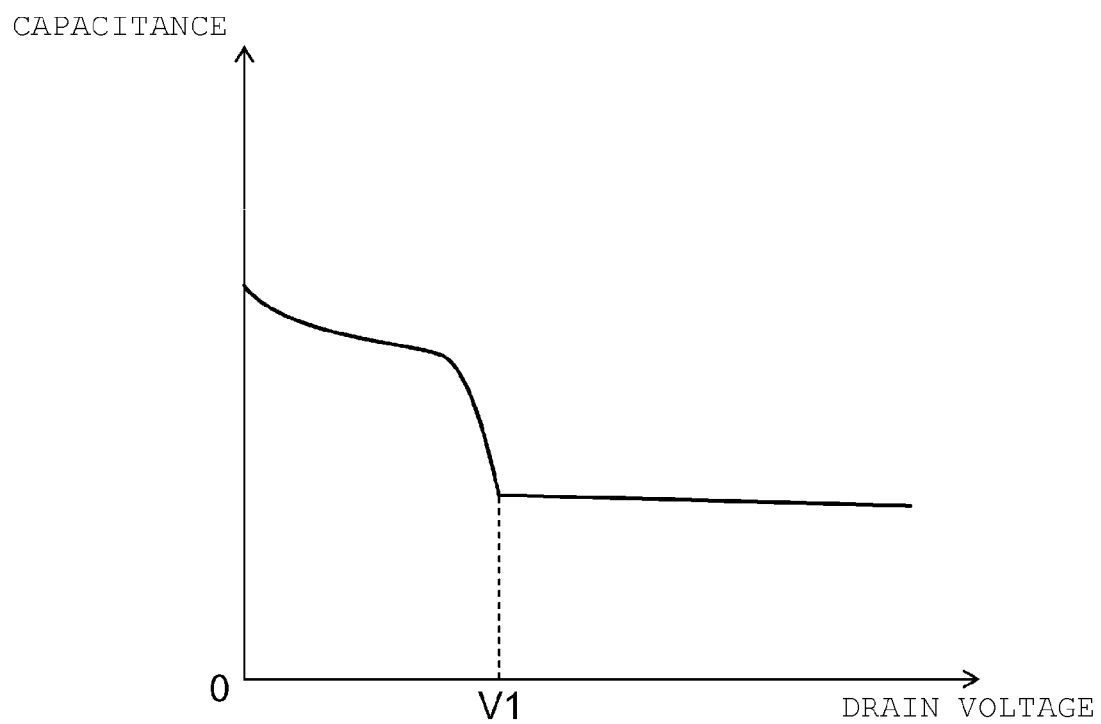
FIGS. 9A and 9B are graphs illustrating a relation between a drain voltage and each capacitance in the semiconductor device according to the first embodiment.
Figure 9B:
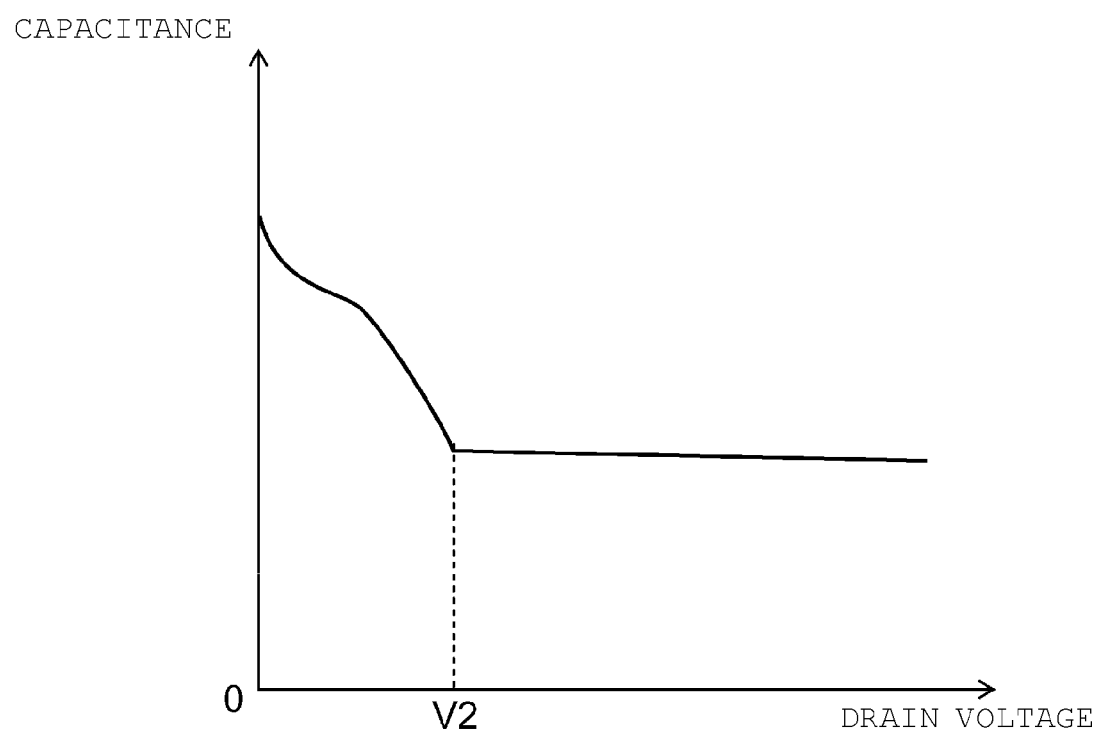
Figure 10:
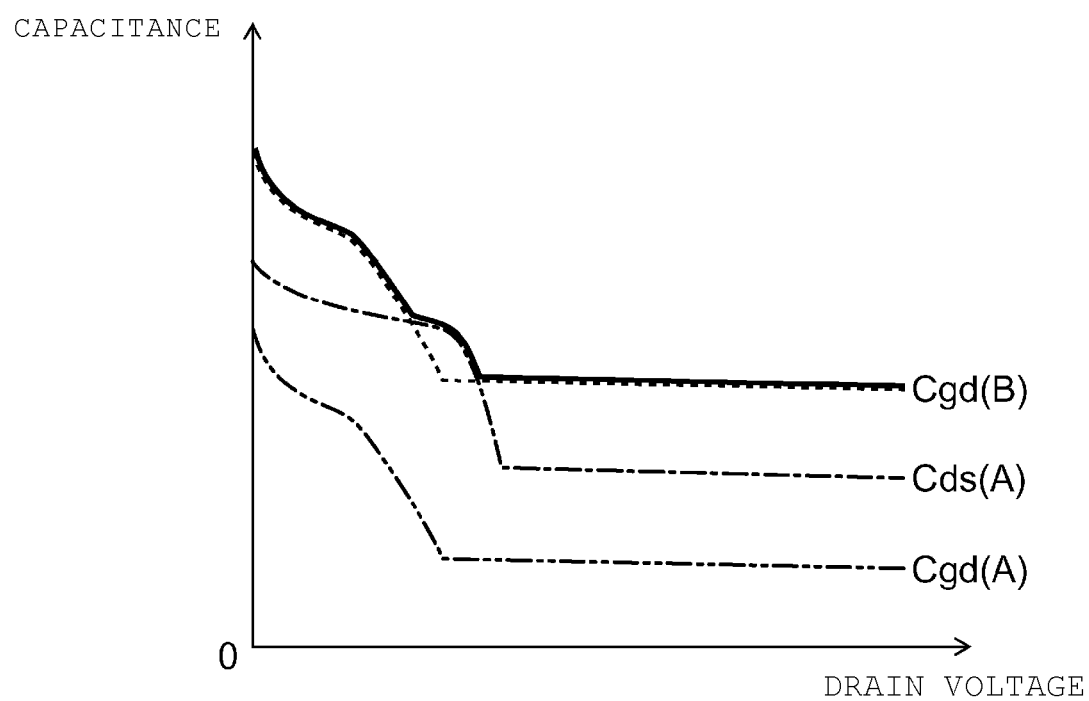
FIG. 10 is a graph illustrating a relation between the drain voltage and each capacitance in the semiconductor device according to the first embodiment.

FIGS. 9A to 10 are graphs showing the relationship between the drain voltage and the respective capacitances when the device is turned off in the semiconductor device 100 according to the first embodiment.

Specifically, FIG. 9A shows the relationship between the drain voltage and the drain to source capacitance. FIG. 9B shows the relationship between the drain voltage and a gate to drain capacitance.

FIG. 10 shows the relationship between the drain voltage and the respective capacitances connected between the gate and the drain.

In FIGS. 9A to 10, the vertical axis represents the capacitance, and the horizontal axis represents the drain voltage. In addition, the horizontal axis representing the drain voltage in FIGS. 9A to 10 is represented in a linear scale, and the vertical axis representing the capacitance is represented in a logarithm scale.

When a semiconductor device is turned off, the drain potential and the current oscillate (switching noise), which is caused by overshooting in accordance with an increase of the drain voltage and a drain current blockage.

The switching noise becomes larger as the frequency of oscillation is increased. On the other hand, the switching frequency is reduced as the magnitude of the gate-drain capacitance (Cgd(A) and Cgd(B)) and the magnitude of the drain-source capacitance (Cds(A) and Cds(B)) are increased.

Therefore, the switching oscillation frequency can be lowered by increasing these capacitances and thereby suppress switching noise.

However, when the gate-drain capacitance is increased, the time required to transition (turn on) the semiconductor device from the OFF state to the ON state is increased, and the switching loss of the semiconductor device is increased.

In particular, in the semiconductor device having the SJ structure, the n$^-$ type semiconductor region 1 and the p$^-$ type pillar region 2 are depleted in a short time when the device is turning off, and the change of the drain voltage with respect to time is increased, i.e., the time to achieve a lower drain voltage is decreased. In addition, the drain-source capacitance is rapidly reduced by the depletion of the n$^-$ type semiconductor region 1 and the p$^-$ type pillar region 2 when the device is turning off.

With these factors, the semiconductor device having the SJ structure causes a lot of switching noise compared to a semiconductor device not having SJ structure.

The above factors will be specifically described using FIGS. 9A and 9B.

As illustrated in FIGS. 9A and 9B, the drain to source capacitance and the gate to drain capacitance are reduced as the drain voltage is increased.

The drain to source capacitance decreases with increasing voltage until the drain voltage reaches a voltage V1, and becomes substantially constant when the drain voltage is equal to or more than the voltage V1. The gate to drain capacitance is reduced until the drain voltage reaches a voltage V2, and becomes substantially constant when the drain voltage is equal to or more than the voltage V2.

As described above, the reduction of the drain to source capacitance is caused by the depletion of the n$^-$ type semiconductor region 1 and the p$^-$ type pillar region 2 when the device is turning off. On the contrary, the reduction of the gate to drain capacitance is caused by the depletion of the JFET structure formed of the n$^-$ type semiconductor region 1 and the p type base region 3 in addition to the depletion of the n$^-$ type semiconductor region 1 and the p$^-$ type pillar region 2 similarly to the drain to source capacitance. Therefore, as illustrated in FIGS. 9A and 9B, the voltage V2 is lower than the voltage V1, and the gate-drain capacitance is reduced to a substantially constant value as a result of a smaller change of the drain voltage compared to the drain to source capacitance.

In the semiconductor device having such capacitance characteristics, the gate to drain capacitance in a switching transition period is small, and the switching oscillation frequency is large. Therefore, the switching noise is large. As a method of reducing the switching frequency, there is a method of adding a resistor between the gate electrode 10 and an external gate driving circuit. With the added resistor, the time required for the voltage of the gate electrode 10 to reach a threshold value or more after a voltage starts to be applied to the gate electrode 10 can be increased, and the switching oscillation can be lowered. However, in the semiconductor device having a small gate to drain capacitance, the degree of reduction of the switching oscillation frequency caused by the added resistor is small, and the suppression of the switching noise is not significant.

Therefore, the gate to drain capacitance when turning off desirably should be larger in order to suppress the switching noise when the semiconductor device is turned off.

In this regard, in the semiconductor device according to this embodiment, the third portion 2c of the p$^-$ type pillar region 2 is provided below the gate pad 33, and the capacitance Cds(A) is formed between the third portion 2c and the first portion 1a of the n$^-$ type semiconductor region 1.

The capacitance Cds(A) can be considered as being connected to the capacitance Cgd(B) in parallel when turning off the device as illustrated in the equivalent circuits of FIGS. 6 to 8.

As illustrated in FIG. 10, the capacitance Cds(A) will be smaller than the capacitance Cgd(B) when the semiconductor device is in the ON state. This is because the area of the gate pad 33 is smaller than that of the source electrode 32 and a facing area between the first portion 1a and the third portion 2c below the gate pad 33 is smaller than that between the second portion 1b and the fourth portion 2d below the source electrode 32.

When the semiconductor device is turned off from this state, the drain voltage is increased by the depletion of the respective semiconductor regions, and the respective capacitances are lowered. At this time, as described above, the capacitance Cgd(A) and the capacitance Cgd(B) of the gate-drain capacitance are reduced to a substantially constant value as a result of a smaller change in the drain voltage as compared to the capacitance Cds(B) of the drain-source capacitance.

As a result, the capacitance Cds(A) becomes temporarily larger than the capacitance Cgd(B) during a period when the semiconductor device is transitioned from the ON state to the OFF state.

As described above, noting that the vertical axis in FIG. 10 is represented in a logarithm scale, a sum of the capacitances Cgd(B), Cds(A), and Cgd(A) in the respective drain voltages becomes almost the same as the largest one among these capacitances. Therefore, the capacitance plotted by the solid line of FIG. 10 becomes a value substantially equal to the largest value among the capacitances Cgd(B), Cds(A), and Cgd(A) at the respective drain voltage values.

Therefore, the capacitance between the gate and the drain when the device is turning off becomes substantially the capacitance plotted by the solid line of FIG. 10. As the device is turning off, the capacitance Cds(A) is temporarily larger than the capacitance Cgd(B). As a result, the gate-drain capacitance when turning off becomes larger in the drain voltage range where capacitance Cds(A) is temporarily larger than the capacitance Cgd(B), and the gate-drain capacitance is smoothly changed. Therefore, it is possible to reduce the switching noise of the semiconductor device.

In addition, in a case where the switching noise of the semiconductor device is reduced by this effect, the capacitance Cds(A) is temporarily larger than the capacitance Cgd(B) only when the semiconductor device is being turned off. Therefore, it is possible to suppress an increase in the switching time when the semiconductor device is turned on.

In other words, according to this embodiment, the switching noise of the semiconductor device can be reduced while not increasing the switching loss of the semiconductor device.

Further, the n type impurity concentration in the n⁻ type semiconductor region 1 may be the same as the p type impurity concentration in the p⁻ type pillar region 2, or may be different.

For example, the capacitance Cgd(B) can be increased and the switching noise of the semiconductor device can be further reduced by setting the n type impurity concentration in the n⁻ type semiconductor region 1 higher than the p type impurity concentration in the p⁻ type pillar region 2.

Alternatively, the p type impurity concentration in the p⁻ type pillar region 2 may be higher than the n type impurity concentration in the n⁻ type semiconductor region 1 to achieve the same result.

Second Embodiment

Figure 11A:
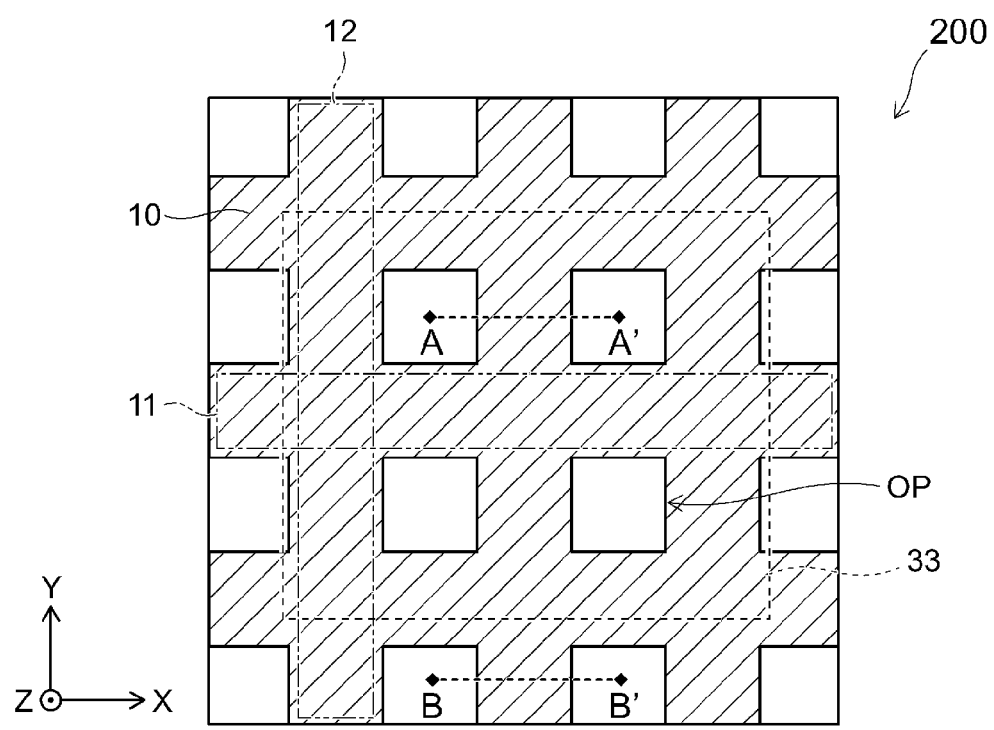
FIGS. 11A and 11B are plan views illustrating a part of a semiconductor device according to a second embodiment.
Figure 11B:
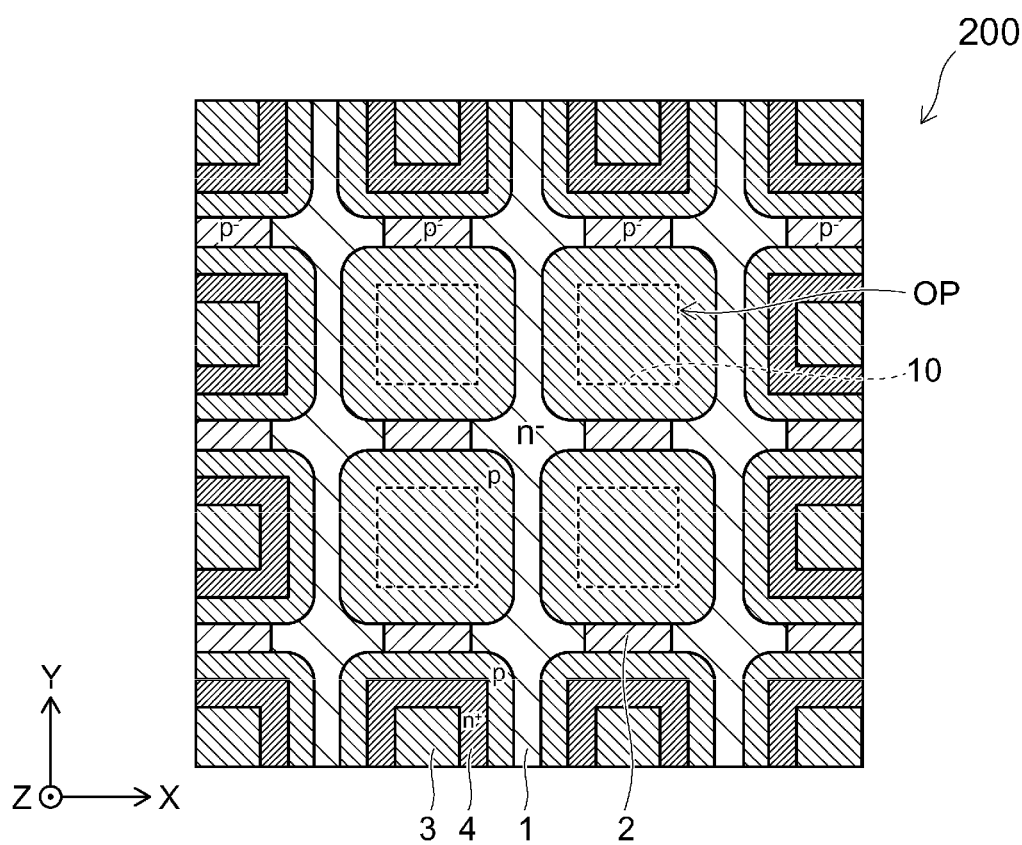
Figure 12A:
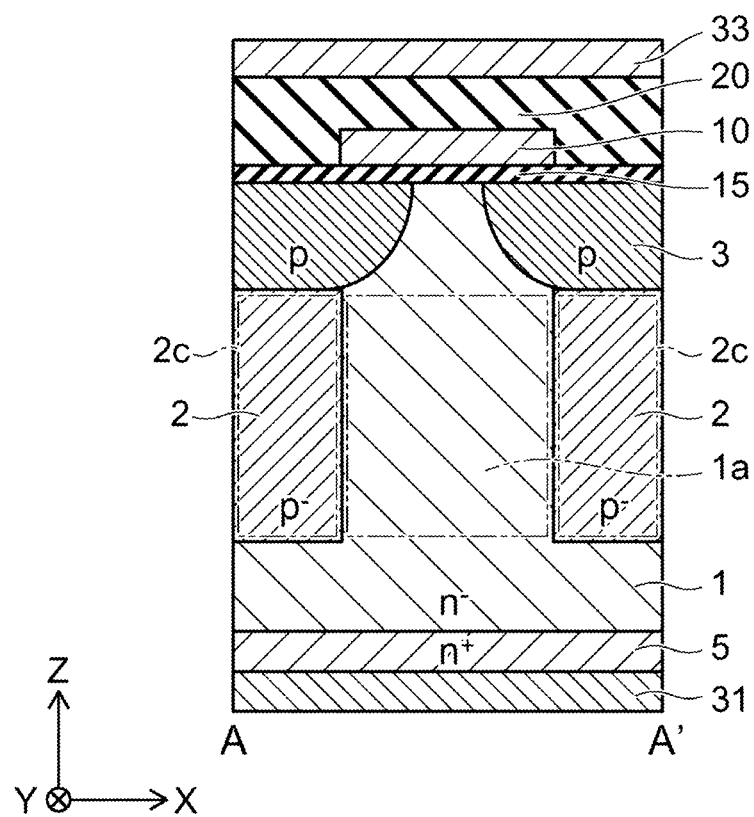
FIG. 12A is a cross-sectional view taken along a line A-A' of FIG. 11A.
Figure 12B:
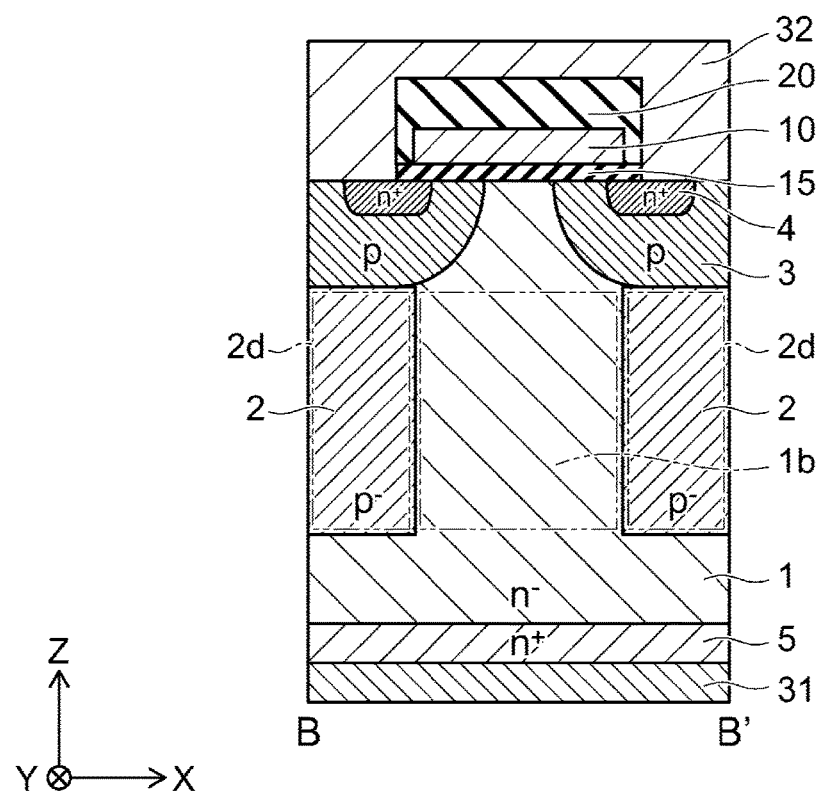
FIG. 12B is a cross-sectional view taken along a line B-B' of FIG. 11A.

FIGS. 11A and 11B are plan views illustrating a part of a semiconductor device 200 according to a second embodiment. FIG. 12A is a cross-sectional view taken along a line A-A' of FIG. 11A. FIG. 12B is a cross-sectional view taken along a line B-B' of FIG. 11A.

In the depiction of the device of FIG. 11A, the insulating portion 20 and the gate pad 33 are omitted, and the source electrode 32 is depicted using a broken line.

In the depiction of the device of FIG. 11B, the insulating portion 20, the source electrode 32, and the gate pad 33 are omitted, and the gate electrode 10 is depicted using a broken line.

As illustrated in FIG. 11A, the gate electrode 10 is provided in a grid (lattice) shape in the semiconductor device 200 according to this embodiment.

More specifically, the gate electrode 10 includes a first electrode portion 11 extending in the X direction and a second electrode portion 12 extending in the Y direction. A plurality of first electrode portions 11 are provided spaced in the Y direction, and a plurality of second electrode portions 12 are provided spaced in the X direction. These portions intersect with each other, and thus the gate electrode 10 is provided in the grid (lattice) shape.

The gate electrode 10 includes an opening OP. A plurality of openings OP are provided in the X direction and the Y direction in the open regions between the first electrode portions 11 and the second electrode portions 12. As illustrated in FIG. 11B, the p type base regions 3 are provided below the gate pad 33 in correspondence with the openings OP. The p type base regions 3 and the n⁺ type source regions 4 are provided below the source electrode 32 in correspondence with the openings OP. In a region where the n⁺ type source region 4 is provided, the p type base region 3 and the n⁺ type source region 4 are connected to the source electrode 32 through the opening OP.

As illustrated in FIGS. 12A and 12B, similarly to the semiconductor device 100, the n type semiconductor region 1 is provided on the n⁺ type drain region 5, and the p type pillar region 2 extending in the Y direction is provided in the n type semiconductor region 1. A part of the n⁻ type semiconductor region 1 and the p type pillar region 2 are alternately provided in the X direction.

In addition, the n⁻ type semiconductor region 1 includes the first portion 1a and the second portion 1b, and the p type pillar region 2 includes the third portion 2c and the fourth portion 2d.

Therefore, according to this embodiment, similarly to the first embodiment, it is possible to reduce the switching noise of the semiconductor device while also suppressing an increase of the switching loss of the semiconductor device.

In addition, in the semiconductor device 200 according to this embodiment, the gate electrode 10 is provided in the grid shape. Therefore, the electric resistance of the gate electrode 10 can be reduced compared to a case where the gate electrode 10 extends in only one direction.

In other words, according to this embodiment, it is possible to make the resistance Rg(A) shown in the equivalent circuit of FIG. 6 smaller compared to that in the first embodiment. With the reduction of the resistance Rg(A), the ratio of the capacitance Cds(A) temporarily larger than the capacitance Cgd(B) is increased, and the switching noise of the semiconductor device is even further reduced.

Furthermore, in the semiconductor device 200 according to this embodiment, the p type base regions 3 are provided on the p⁻ type pillar region 2 spaced from each other in the Y direction. In other words, the p type base region 3 (the third semiconductor region) provided below the source electrode 32 illustrated in FIG. 12B and the p type base region 3 (a fifth semiconductor region) provided below the gate pad 33 illustrated in FIG. 12A are spaced from each other in the Y direction.

Therefore, the resistance Rs(A) illustrated in the equivalent circuit of FIG. 6 is further increased compared to the first embodiment. With the increase of the resistance Rs(A), the ratio of the capacitance Cds(A) temporarily larger than the capacitance Cgd(B) can be increased, and the switching noise of the semiconductor device can be further suppressed.

Third Embodiment

Figure 13A:
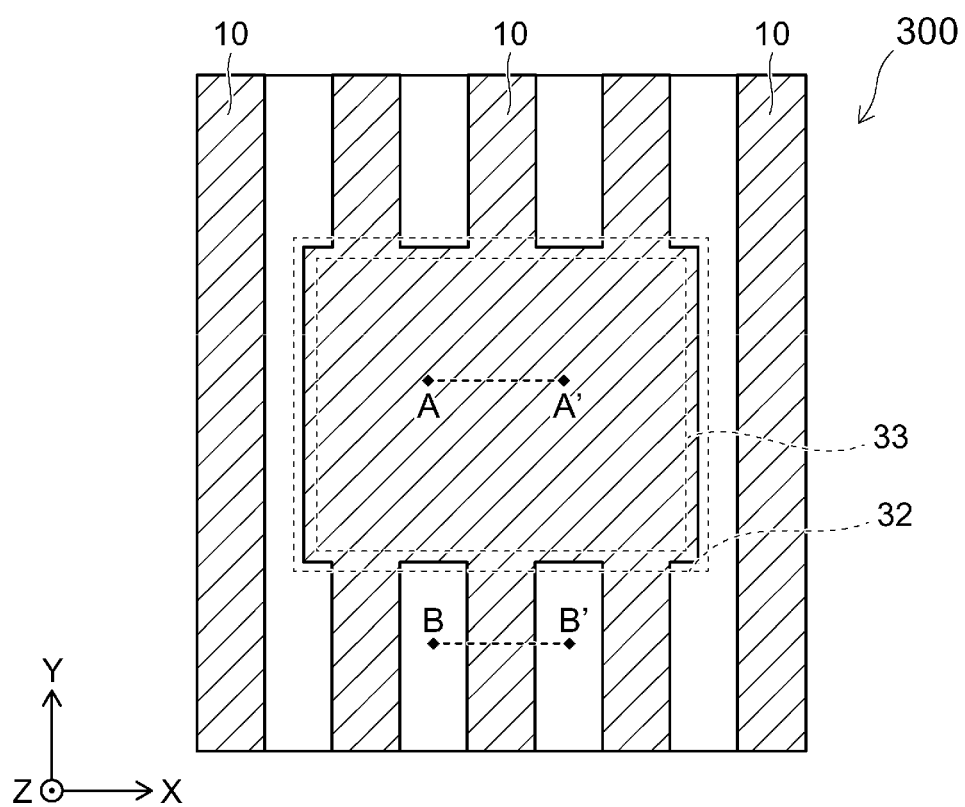
FIGS. 13A and 13B are plan views illustrating a part of a semiconductor device according to a third embodiment.
Figure 13B:
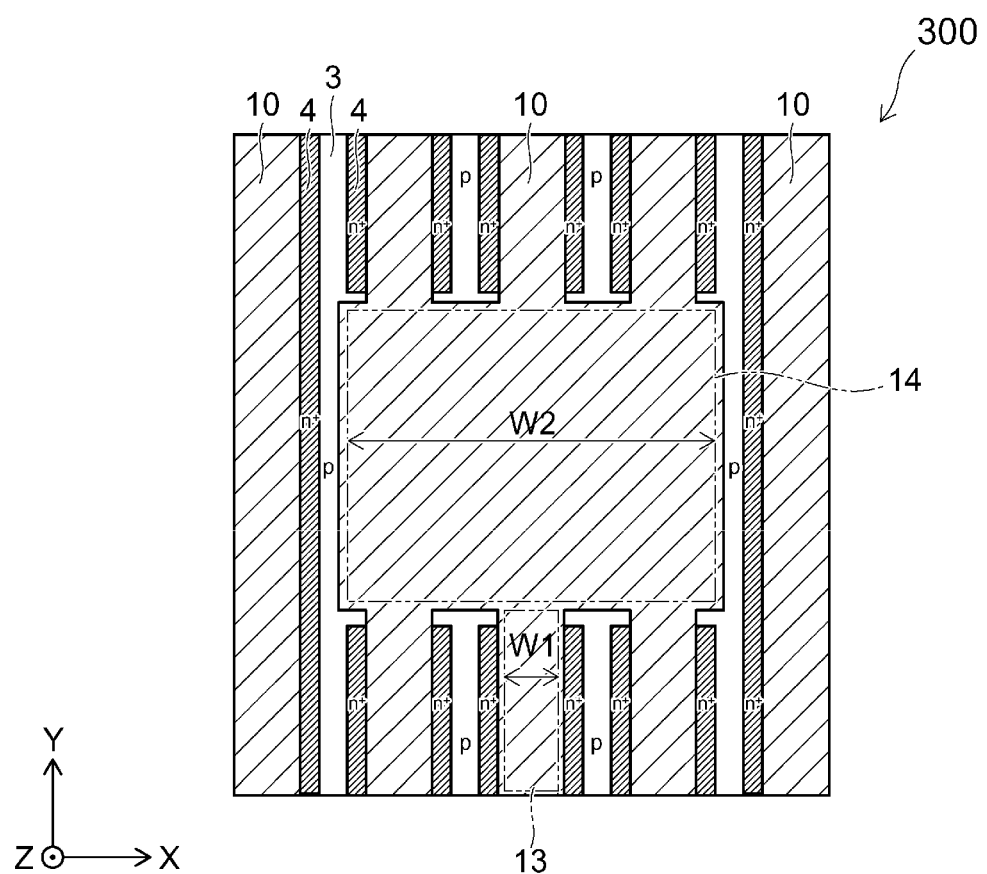
Figure 14A:
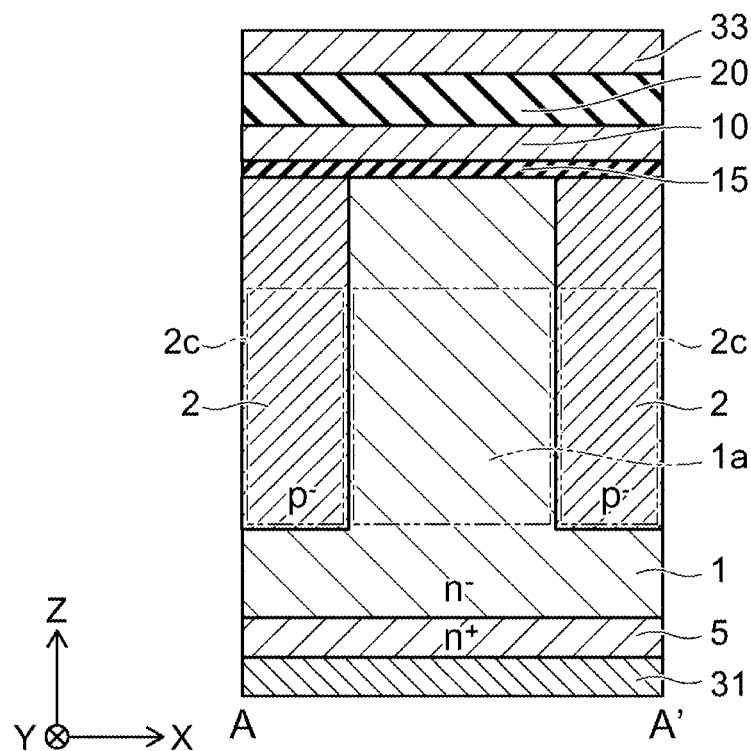
FIG. 14A is a cross-sectional view taken along a line A-A' of FIG. 13A.
Figure 14B:
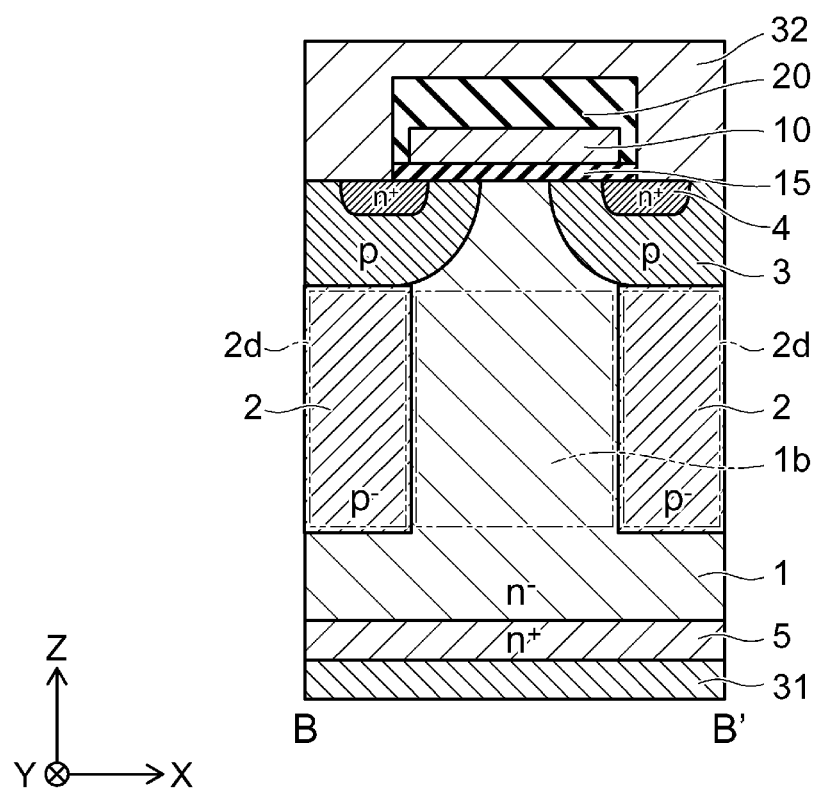
FIG. 14B is a cross-sectional view taken along a line B-B' of FIG. 13A.

FIGS. 13A and 13B are plan views illustrating a part of a semiconductor device 300 according to a third embodiment. FIG. 14A is a cross-sectional view taken along a line A-A' of FIG. 13A. FIG. 14B is a cross-sectional view taken along a line B-B' of FIG. 13A.

In the view of the device of FIGS. 13A and 13B, the insulating portion 20 is omitted, and the source electrode 32 and the gate pad 33 are depicted using the broken line.

In the semiconductor device 300 according to this embodiment, as illustrated in FIGS. 13A and 13B, the gate electrode 10 is provided beneath the entire surface of the gate pad 33.

In other words, the gate electrode 10 includes a third electrode portion 13 located below the source electrode 32 and a fourth electrode portion 14 located below the gate pad 33. In addition, a width (a length in the X direction) W2 of the fourth electrode portion 14 is wider than that of the third electrode portion 13. The fourth electrode portion 14 is connected to the plurality of third electrode portions 13 which are spaced in the X direction.

Since the gate electrode 10 includes the fourth electrode portion 14 having a wide width, the resistance in the gate electrode 10 can be further reduced. In other words, according to this embodiment, the resistance Rg(A) illustrated in the equivalent circuit of FIG. 6 can be further reduced compared to that of the second embodiment.

In addition, since the p type base region 3 is not provided below the gate pad 33, the resistance Rs(A) can be further increased compared to the second embodiment.

In other words, according to this embodiment, the switching noise of the semiconductor device is further suppressed compared to that of the second embodiment.

In addition, in the semiconductor device 300, the p type base region 3 is not provided below the gate pad 33 as illustrated in FIGS. 14A and 14B. In other words, the p type base region 3 is provided only on the fourth portion 2d of the p⁻ type pillar region 2.

In a case where the p type base region 3 is not provided below the gate pad 33, the facing area between the gate electrode 10 and the n⁻ type semiconductor region 1 through the gate insulating portion 15 can be increased. Therefore, the capacitance Cdg(A) illustrated in FIG. 6 can be increased, and the switching noise of the semiconductor device can be further reduced.

Figure 15A:
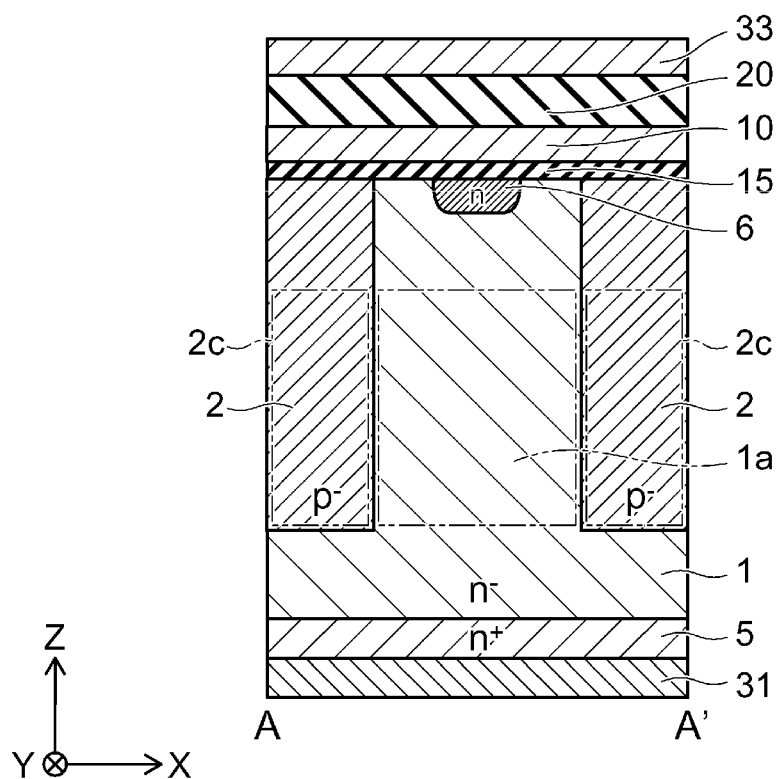
FIGS. 15A and 15B are cross-sectional views illustrating a part of a semiconductor device according to a modification of the third embodiment.
Figure 15B:
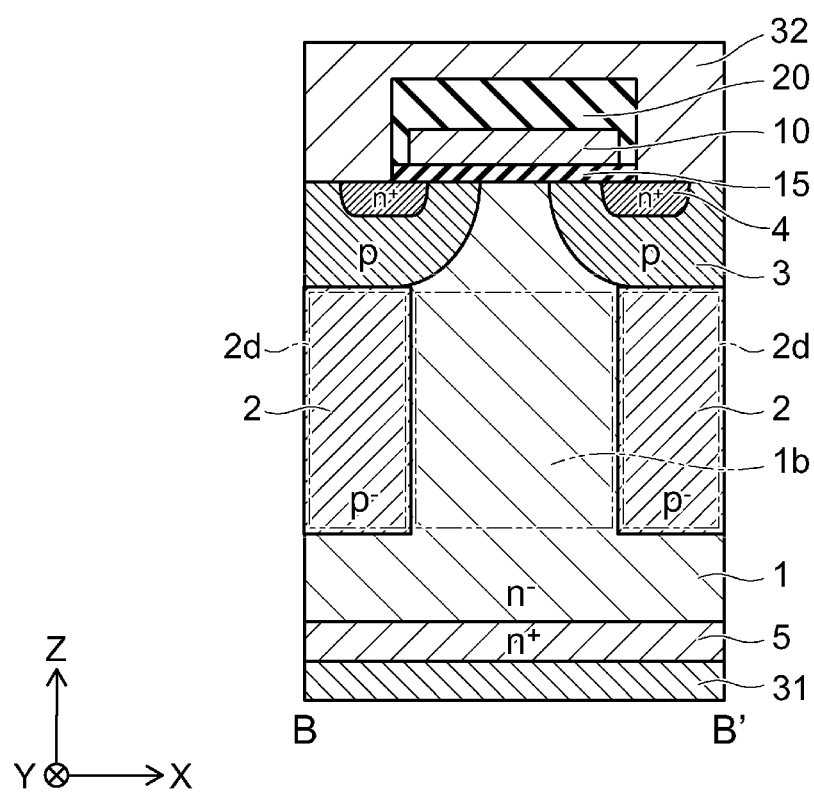

FIGS. 15A and 15B are cross-sectional views illustrating a portion of a semiconductor device according to a modification of the third embodiment.

FIG. 15A is a cross-sectional view taken along a line A-A' of FIG. 13A. FIG. 15B is a cross-sectional view taken along a line B-B' of FIG. 13A.

In the semiconductor device according to this modification, an n type semiconductor region 6 (a sixth semiconductor region) is provided on the first portion 1a of the n⁻ type semiconductor region 1. The n type impurity concentration in the n type semiconductor region 6 is higher than that in the n⁻ type semiconductor region 1.

With the n type semiconductor region 6, the region facing the gate electrode 10 is hardly depleted when the semiconductor device is turned off. In other words, since the n type semiconductor region 6 is provided below the gate pad 33, the capacitance Cgd(A) illustrated in FIG. 6 can be increased.

Therefore, according to this modification, the switching noise of the semiconductor device can be further reduced compared to that of the semiconductor device 300.

Further, the n type semiconductor region 6 is not limited to the semiconductor device 300 of the third embodiment, and can be applied even to the semiconductor device according to the first and second embodiments. When the n type semiconductor region 6 is provided in the semiconductor device according to these embodiments, the switching noise of the semiconductor device can be further reduced.

Fourth Embodiment

Figure 16A:
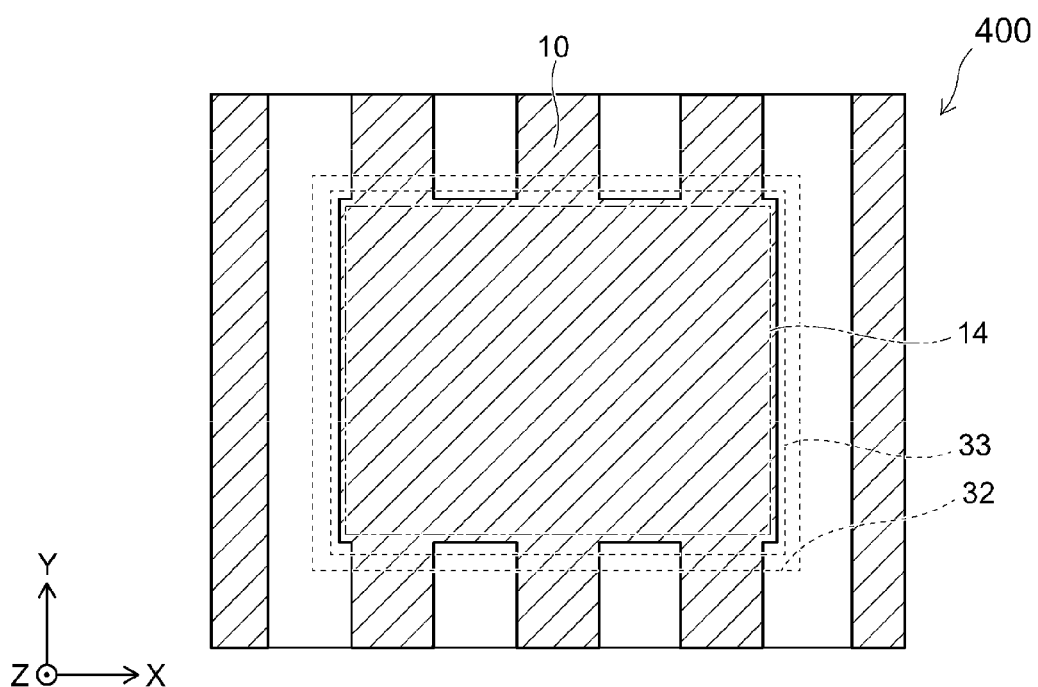
FIGS. 16A and 16B are plan views illustrating a part of a semiconductor device according to a fourth embodiment.
Figure 16B:
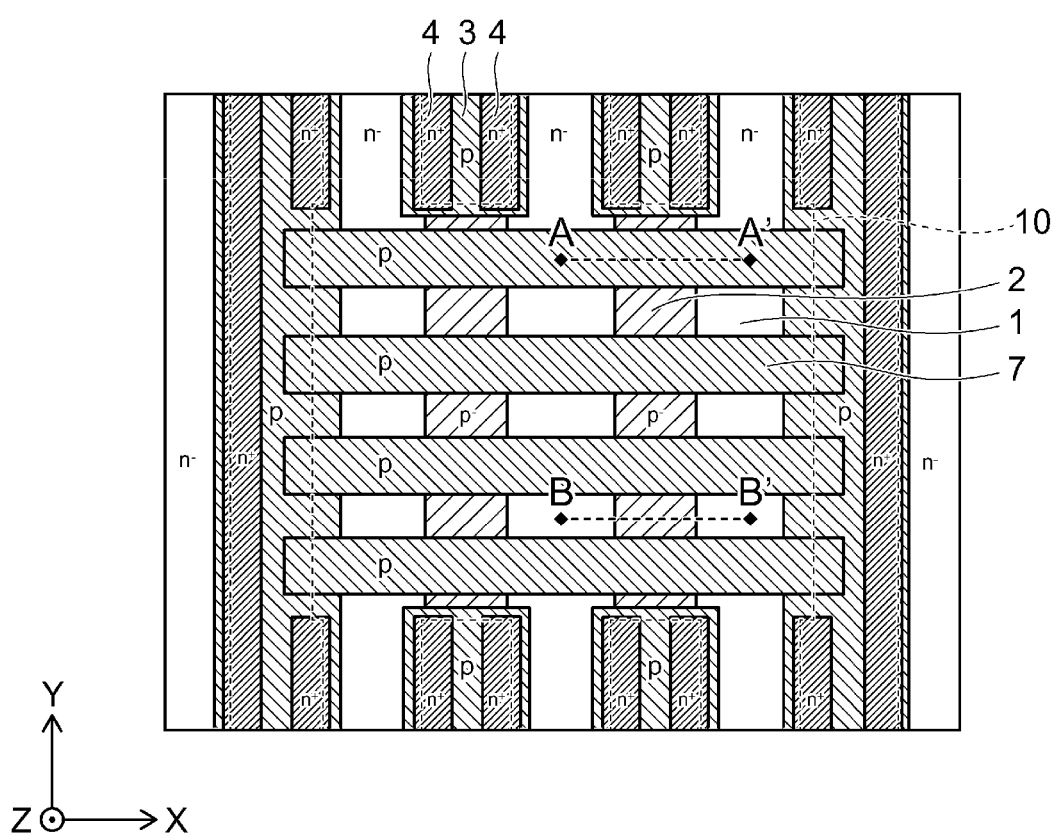

FIGS. 16A and 16B are plan views illustrating a part of a semiconductor device 400 according to a fourth embodiment.

Figure 17A:
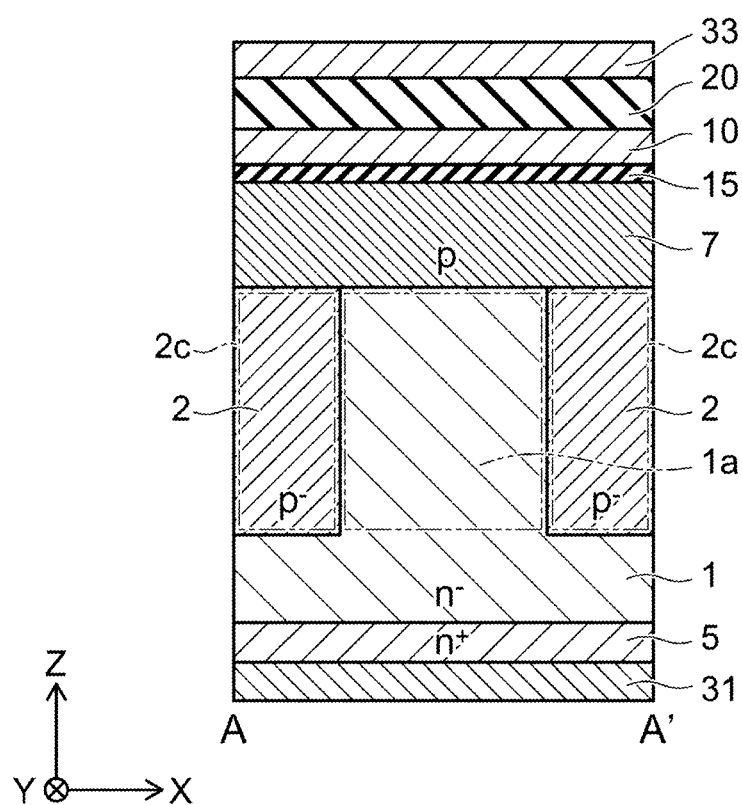
FIG. 17A is a cross-sectional view taken along a line A-A' of FIG. 16B.
Figure 17B:
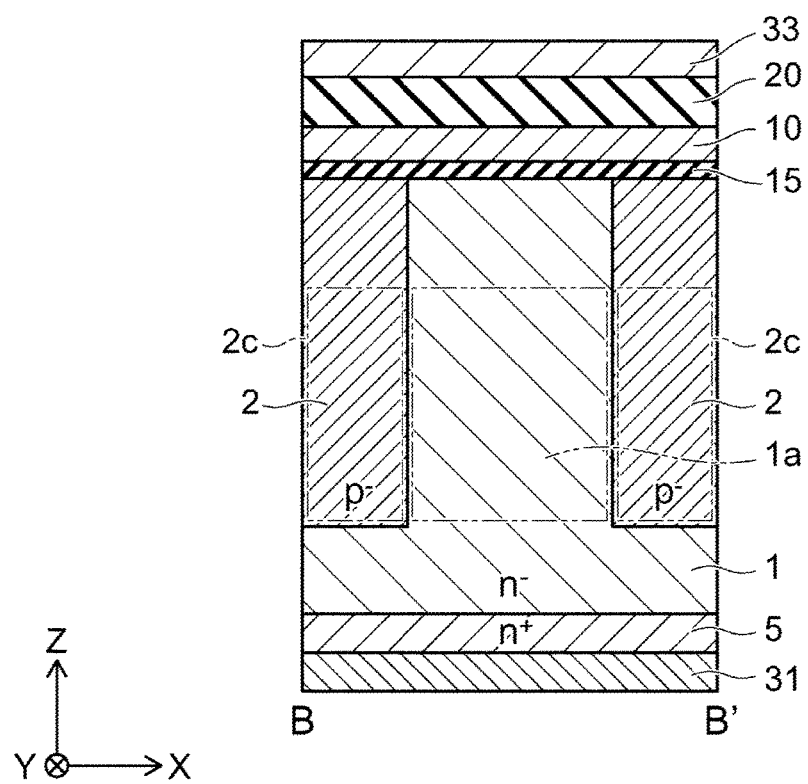
FIG. 17B is a cross-sectional view taken along a line B-B' of FIG. 16B.

FIG. 17A is a cross-sectional view taken along a line A-A' of FIG. 16B. FIG. 17B is a cross-sectional view taken along a line B-B' of FIG. 16B.

In the view of the device 400 in FIG. 16A, the insulating portion 20 is omitted, and the source electrode 32 and the gate pad 33 are depicted using the broken line. In the view of the device 400 in FIG. 16B, the gate insulating portion 15, the insulating portion 20, the source electrode 32, and the gate pad 33 are omitted, and the gate electrode 10 is depicted using the broken line.

The semiconductor device 400 is different from the semiconductor device 300, for example, in that a p type semiconductor region 7 (a seventh semiconductor region) is additionally provided.

As illustrated in FIG. 16A, the fourth electrode portion 14 of the gate electrode 10 is provided under the entire surface of the gate pad 33 similarly to the semiconductor device 300.

A plurality of p type semiconductor regions 7 are provided below the fourth electrode portion 14 as illustrated in FIG. 16B.

The plurality of p type semiconductor regions 7 are spaced from each other in the Y direction, and each of them extend in the X direction. The end portions of the p type semiconductor regions 7 in the X direction each abut the p type base region 3.

As illustrated in FIG. 17A, the p type semiconductor region 7 is provided on the first portion 1a of the n⁻ type semiconductor region 1 and on the third portion 2c of the p⁻ type pillar region 2.

In a region between the p type semiconductor regions 7, a part of the n⁻ type semiconductor region 1 faces the gate electrode 10 only through the gate insulating portion 15 as illustrated in FIG. 17B.

The semiconductor device according to each embodiment is built with a diode in which the p type pillar region 2 and the p type base region 3 serve as an anode, and the n⁻ type semiconductor region 1 and the n⁺ type drain region 5 serve as a cathode. When a surge voltage is applied to the semiconductor device, and the semiconductor device is operated as a forward diode, holes are implanted from the source electrode 32 to the p type base region 3, and the electrons are implanted from the drain electrode 31 to the n⁺ type drain region 5.

When the diode operation of the semiconductor device is ended, and a positive voltage is applied to the drain electrode 31 with respect to the source electrode 32 (at the time of recovery), the electrons accumulated in the n⁻ type semiconductor region 1 are discharged from the drain electrode 31 through the n⁺ type drain region 5, and the holes are discharged from the source electrode 32 through the p⁻ type pillar region 2 and the p type base region 3.

When the holes are discharged to the source electrode 32, the holes accumulated in the n⁻ type semiconductor region 1 below the gate pad 33 flow in the p⁻ type pillar region 2 in the Y axis direction, and are discharged through the p type base region 3 connected to the source electrode 32. Therefore, the holes accumulated in the n⁻ type semiconductor region 1 below the gate pad 33 take a long time until being discharged compared to the holes accumulated in the n⁻ type semiconductor region 1 below the source electrode 32. Therefore, the time required for the depletion of the n⁻ type semiconductor region 1 and the p⁻ type pillar region 2 below the gate pad 33 is longer than a time taken for the depletion of the n⁻ type semiconductor region 1 and the p⁻ type pillar region 2 below the source electrode 32.

In a case where the semiconductor region below the source electrode 32 is depleted, and the semiconductor region below the gate pad 33 is not depleted, a high voltage is locally added between the semiconductor region and the gate electrode 10 below the gate pad 33, and the gate insulating portion 15 may be broken down.

In this regard, the p type semiconductor region 7 is provided below the gate pad 33 in this embodiment. While the p⁻ type pillar region 2 extends in the Y direction, the p type semiconductor region 7 extends in the X direction, and abuts the p type base region 3.

With such a structure employed, the holes of the n⁻ type semiconductor region 1 below the gate pad 33 flow in the p type semiconductor region 7 in addition to the p type pillar region 2. Since the holes flow in the p⁻ type pillar region 2 and the p type semiconductor region 7, the time taken for the holes of the n⁻ type semiconductor region 1 to be discharged can be shortened.

Therefore, according to this embodiment, a possibility that the gate insulating portion 15 is broken down at the time of recovery is reduced, and a recovery resistance can be improved compared to the semiconductor device 300.

Further, the p type semiconductor region 7 may also be provided below the entire surface of the fourth electrode portion 14 of the gate electrode 10. With such a p type semiconductor region 7, it is possible to further shorten the time required for the holes in the n⁻ type semiconductor region 1 below the gate pad 33 to be discharged.

On the other hand, in a case where the p type semiconductor region 7 is provided below the entire surface of the fourth electrode portion 14, the facing area between the gate electrode 10 (the fourth electrode portion 14) and the n⁻ type semiconductor region 1 is small compared to an example illustrated in FIG. 16B. When the facing area between the gate electrode 10 and the n⁻ type semiconductor region 1 is small, the capacitance Cgd(A) illustrated in FIG. 6 is small, and the switching noise of the semiconductor device will increase.

Therefore, as illustrated in FIG. 16B, the recovery capability of the device can be improved while preventing an increase of the switching noise of the semiconductor device by providing the plurality of p type semiconductor regions 7 spaced from each other.

In addition, in the semiconductor device 400 according to this embodiment, the shape of the gate electrode 10 below the gate pad 33 is arbitrarily set. Similarly to the semiconductor device 100, the gate electrodes 10 may be arranged below the gate pad 33 spaced in the X direction and extending in the Y direction. In addition, the gate electrode 10 may include a portion extending in the X direction and a portion extending in the Y direction below the gate pad 33 similarly to the semiconductor device 200.

Similarly, the shape and the arrangement of the p type semiconductor region 7 can also be appropriately changed.

Figure 18A:
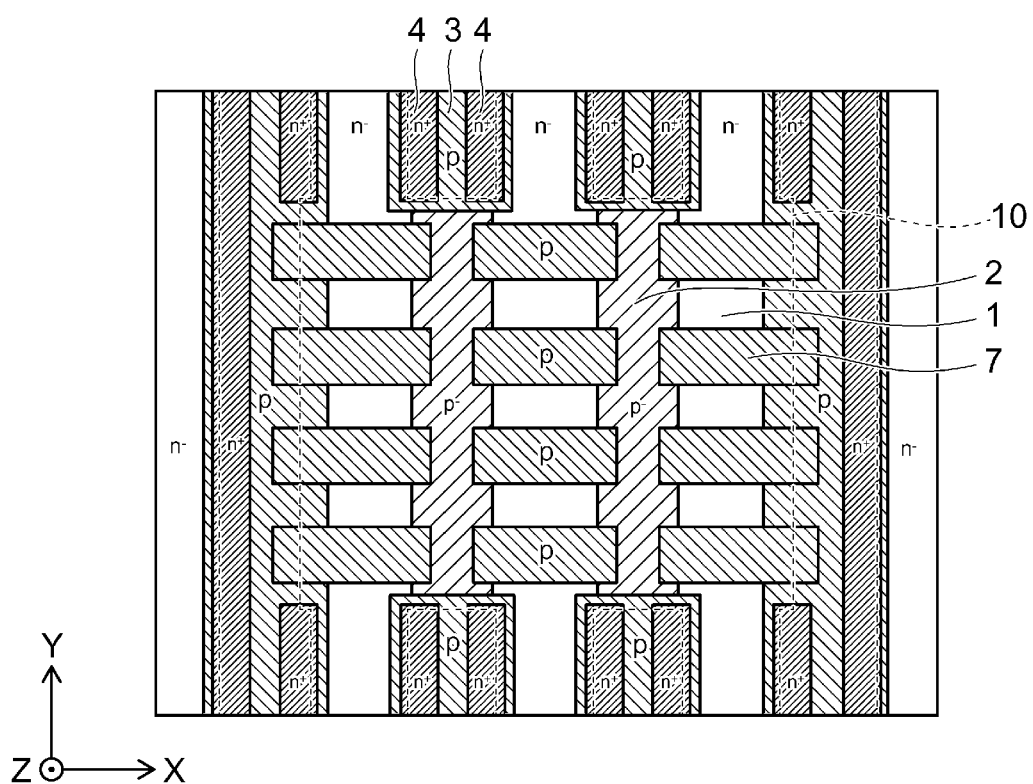
FIGS. 18A and 18B are plan views illustrating a part of a semiconductor device according to a modification of the fourth embodiment.
Figure 18B:
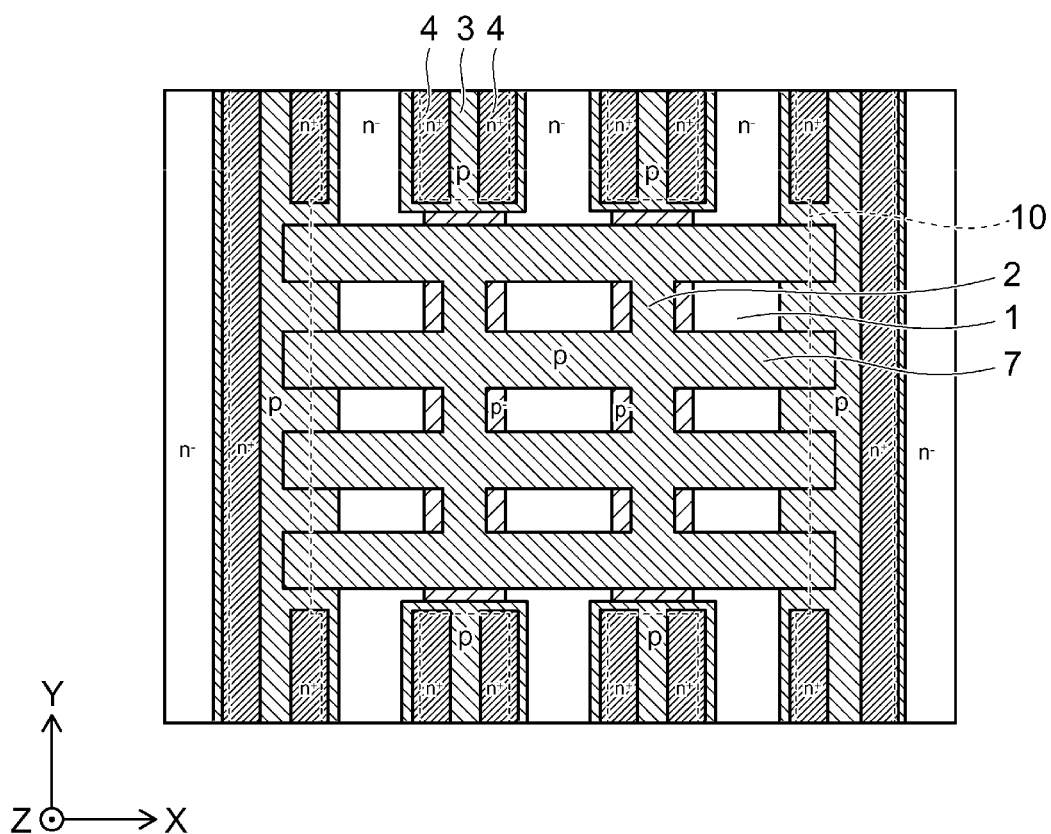

FIGS. 18A and 18B are plan views illustrating a part of the semiconductor device 400 according to a modification of the fourth embodiment.

As illustrated in FIG. 18A, a plurality of p type semiconductor regions 7 are provided spaced apart in the X direction and the Y direction.

The end portion of each p type semiconductor region 7 in the X direction overlies and contacts the p⁻ type pillar region 2.

In a case where the semiconductor device 400 is structured as illustrated in FIG. 18A, the holes accumulated in the n⁻ type semiconductor region 1 flow in the X direction through the p type semiconductor region 7 and the p⁻ type pillar region 2.

As illustrated in FIG. 18B, the p type semiconductor region 7 may include portions extending in the X direction and portions extending in the Y direction connecting these portions. In this case, the resistance when the holes accumulated in the n⁻ type semiconductor region 1 are discharged can be reduced by setting the area of the p type semiconductor region 7 provided on the p⁻ type pillar region 2 to be large, and the recovery capability of the semiconductor device can be further improved.

Fifth Embodiment

Figure 19A:
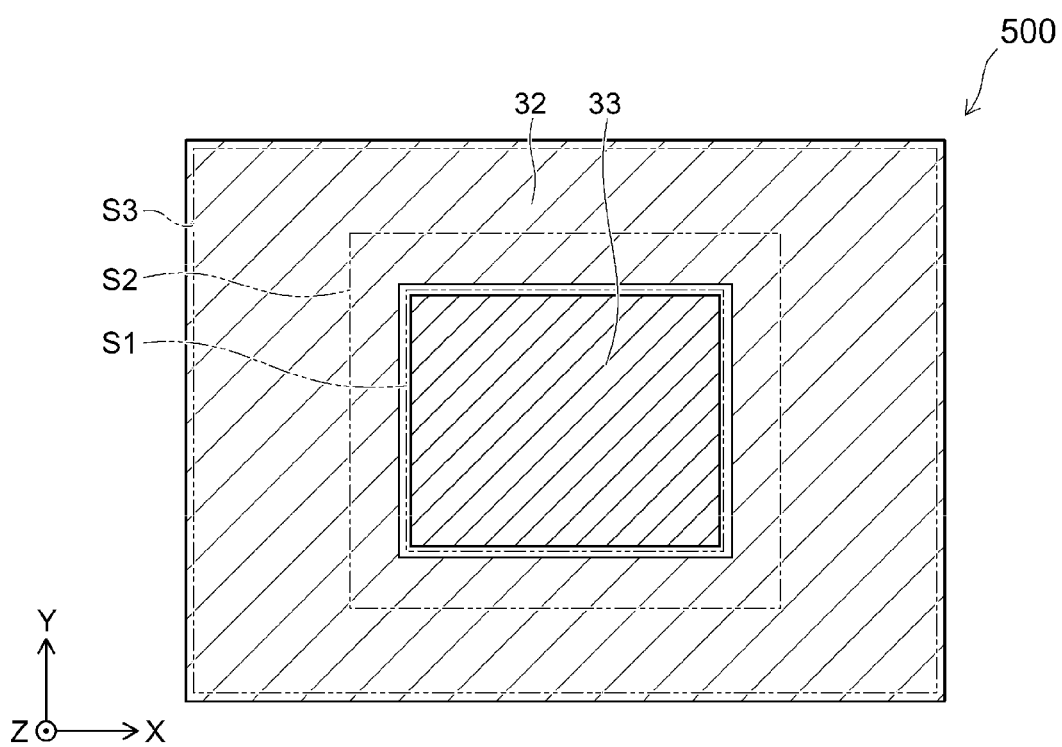
FIGS. 19A and 19B are plan views illustrating a part of a semiconductor device according to a fifth embodiment.
Figure 19B:
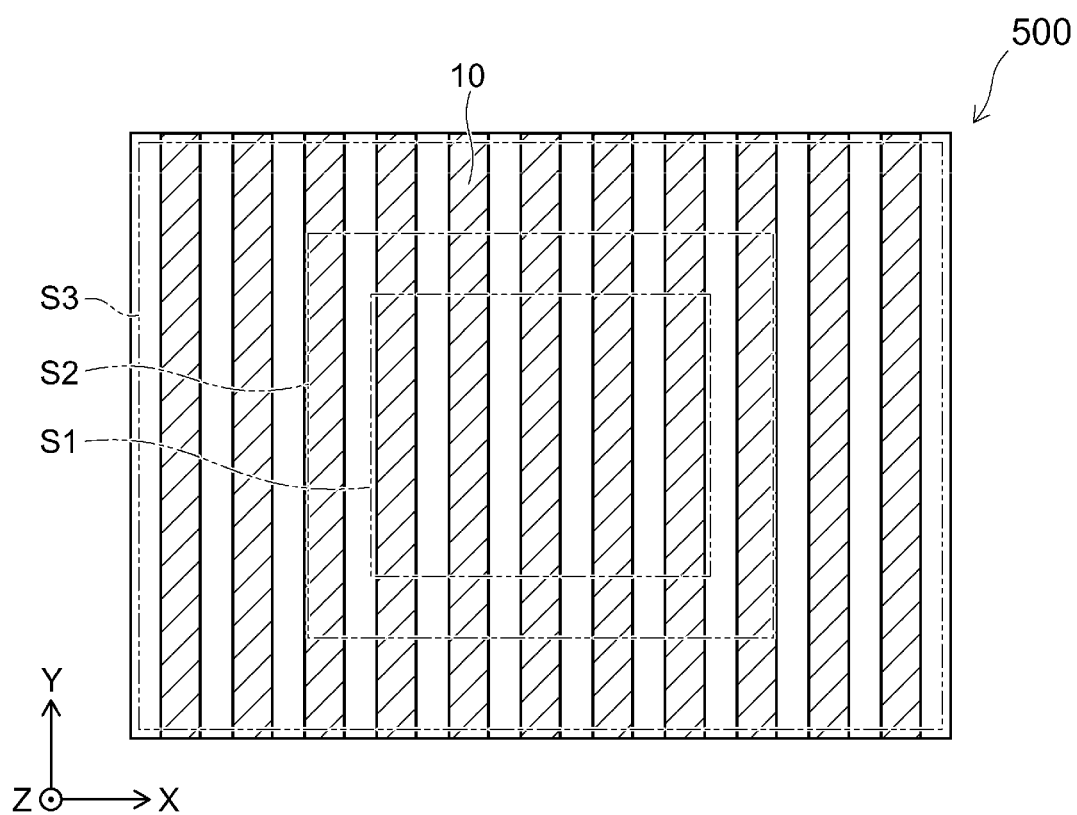
Figure 20:
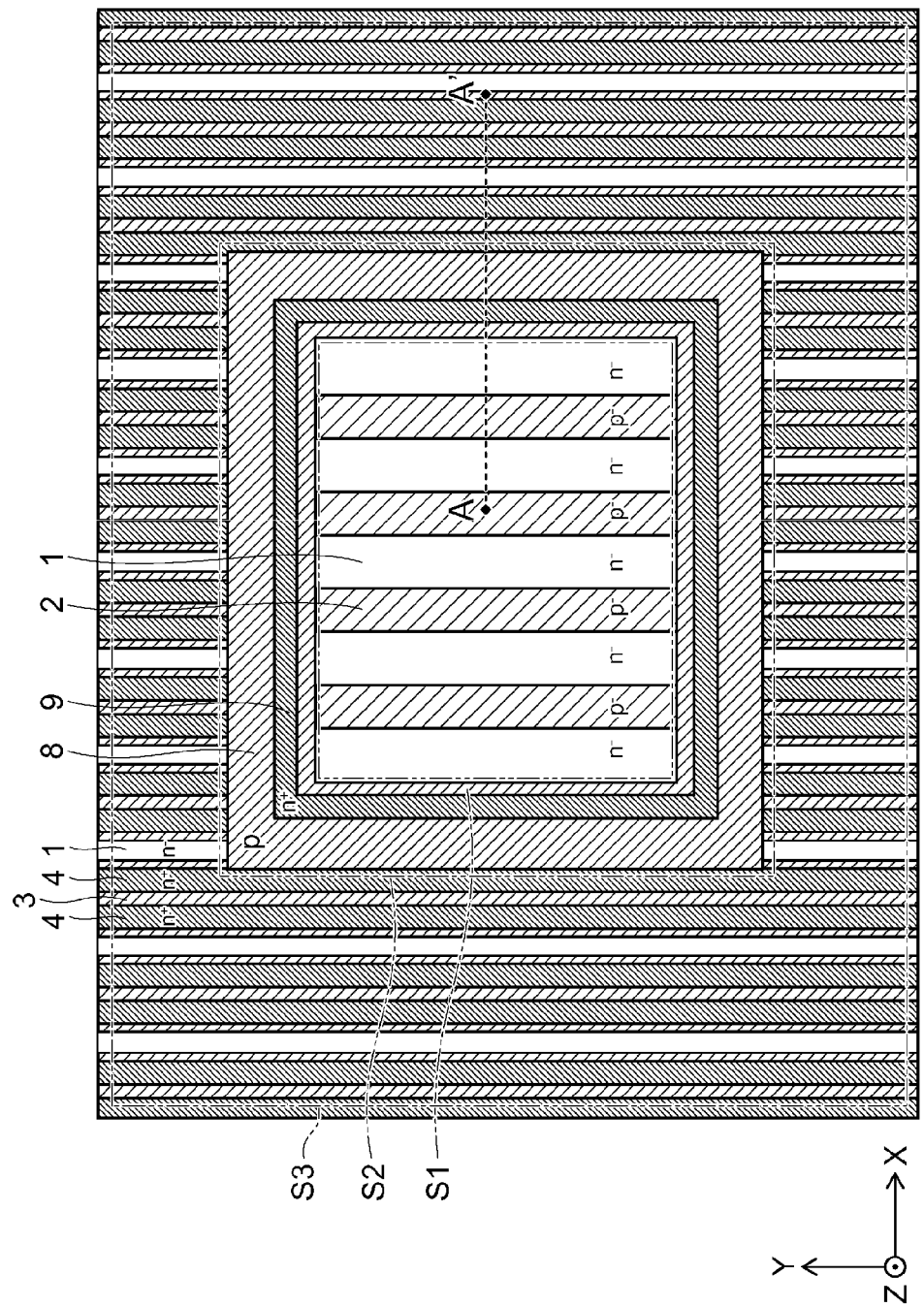
FIG. 20 is a plan view illustrating a part of the semiconductor device according to the fifth embodiment.

FIGS. 19A to 20 are plan views illustrating a part of a semiconductor device 500 according to a fifth embodiment.

Figure 21:
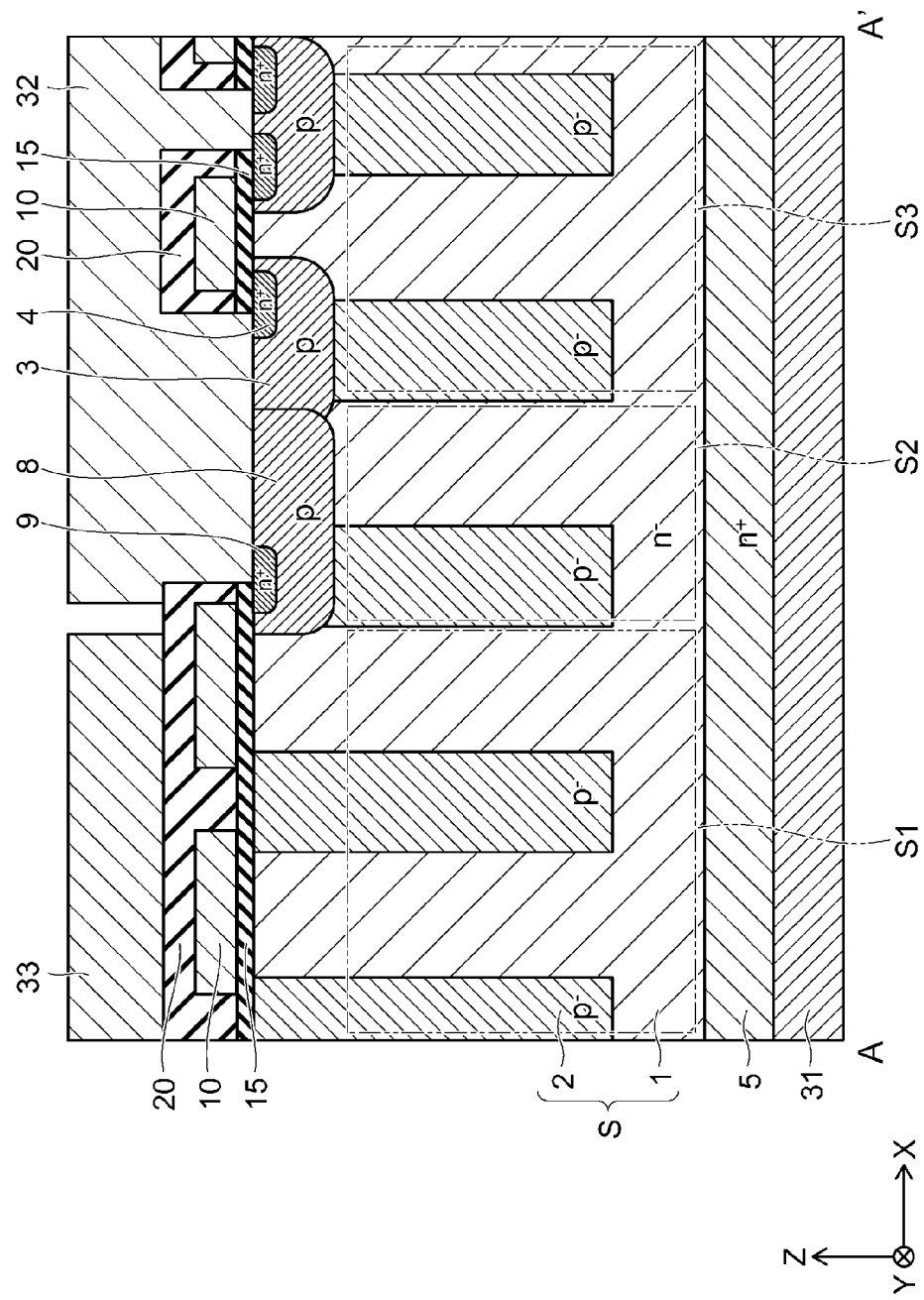
FIG. 21 is a cross-sectional view taken along a line A-A' of FIG. 20.

FIG. 21 is a cross-sectional view taken along a line A-A' of FIG. 20.

In the view of the device 500 of FIGS. 19A to 20, a first portion S1, a second portion S2, and a third portion S3 of a semiconductor portion S which includes the n⁻ type semiconductor region 1 and the plurality of p⁻ type pillar regions 2 are illustrated with a two-dot chain line.

In addition, in the view of the device 500 of FIG. 19B, the insulating portion 20, the source electrode 32, and the gate pad 33 are omitted.

In the view of the device 500 of FIG. 20, the gate electrode 10, the gate insulating portion 15, the insulating portion 20, the source electrode 32, and the gate pad 33 are omitted.

For example, the semiconductor device 500 is different from the semiconductor device 100 in that a p type semiconductor region 8 (an eighth semiconductor region) and an n⁺ type semiconductor region 9 (a ninth semiconductor region) are further included.

As illustrated in FIG. 19A, the semiconductor portion S includes the first portion S1, the second portion S2 provided around the first portion S1, and the third portion S3 provided around the second portion S2.

The gate pad 33 is provided on the first portion S1.

The source electrode 32 is provided on the second portion S2 and the third portion S3.

As illustrated in FIG. 19B, the gate electrode 10 is provided on the first portion S1, the second portion S2, and the third portion S3.

In the example illustrated in FIG. 19B, the gate electrode 10 extends in the Y direction on the first portion S1 to the third portion S3. However, the shape of the portion of the gate electrode 10 located on the first portion S1 is arbitrary.

As illustrated in FIG. 20, the p type base region 3 and the n⁺ type source region 4 are provided in the third portion S3.

The p type semiconductor region 8 and the n⁺ type semiconductor region 9 are provided in the second portion S2.

The p type semiconductor region 8 is provided in a ring shape in the second portion S2 to surround the first portion S1.

The n⁺ type semiconductor region 9 is selectively provided on the p type semiconductor region 8. A plurality of n⁺ type semiconductor regions 9 may be provided in a direction from the first portion S1 toward the third portion S3, and each of them may be provided in a ring or annular shape to surround the first portion S1.

As illustrated in FIG. 21, the source electrode 32 is electrically connected to the p type semiconductor region 8 and the n⁺ type semiconductor region 9 which are provided on the second portion S2, and the p type base region 3 and the n⁺ type source region 4 which are provided on the third portion S3.

As described above, when the semiconductor device is recovering from the diode operation, the holes accumulated in the n⁻ type semiconductor region 1 below the gate pad 33 are discharged to the source electrode 32 through the p type semiconductor region around the gate pad 33.

The p type semiconductor region 8 is provided in the second portion S2 around the first portion S1 which includes the gate pad 33. Therefore, the resistance against the holes flowing toward the source electrode 32 is reduced, and the holes accumulated in the n⁻ type semiconductor region 1 are easily discharged.

On the other hand, when the diode is operated in the forward direction, the electrons injected from the drain electrode 31 are discharged through the source electrode 32. At this time, since the p type semiconductor region 8 is provided, the resistance against the electrons when the electrons injected into a first portion S1 move to the source electrode 32 increases. When the resistance in region S1 increases, the quantity of electrons accumulated in the first portion S1 is increased. Then, a greater amount of holes are injected into the first portion P1 in order to neutralize the accumulated electrons. Therefore, the amount of holes accumulated in the first portion S1 is increased, the first portion S1 is hardly depleted at the time of recovery, and the recovery capability is lowered.

With regard to this problem, the $n^+$ type semiconductor region 9 is selectively provided on the p type semiconductor region 8 in this embodiment. Since the $n^+$ type semiconductor region 9 is provided on the p type semiconductor region 8, the resistance against the electrons when moving to the source electrode 32 can be reduced at the time of the forward operation of the diode. As a result, the quantity of electrons accumulated in the first portion S1 is reduced, and the quantity of holes injected into the first portion S1 is also reduced.

In other words, according to this embodiment, since the p type semiconductor region 8 is provided, the holes can be easily discharged at the time of recovery. Since the $n^+$ type semiconductor region 9 is provided, the amount of holes injected at the time of the forward operation can be reduced.

Therefore, according to this embodiment, the recovery capability of the semiconductor device can be more improved compared to the semiconductor device 100.

In addition, the semiconductor device 500 includes the $n^-$ type semiconductor region 1, the p type semiconductor region 8, and a parasitic NPN transistor which is configured by the $n^+$ type semiconductor region 9.

When the diode is operated in the forward direction, and then a positive voltage is applied to the drain electrode 31 with respect to the source electrode 32, the recovery operation starts, and the $n^-$ type semiconductor region 1 and the $p^-$ type pillar region 2 start to be depleted. At this time, in the $p^-$ type pillar region 2, an extending speed of the depletion layer is slower than that of the $n^-$ type semiconductor region 1 located between the $p^-$ type pillar regions 2. Therefore, the depletion is hardly performed. Since the $n^+$ type semiconductor region 9 is located on the $p^-$ type pillar region 2 where the depletion is hardly performed, the quantity of holes passing through the vicinity of the $n^+$ type semiconductor region 9 is reduced. Therefore, it is possible to suppress an increase of the voltage in the p type semiconductor region in the vicinity of the $n^+$ type semiconductor region 9.

In other words, it is possible to suppress the operation of the parasitic transistor by positioning the $n^+$ type semiconductor region 9 on the $p^-$ type pillar region 2.

Further, even in this embodiment, at least a part of the gate electrode 10 may be provided in a grid shape similarly to the second embodiment. Alternatively, the gate electrode 10 may include the fourth electrode portion 14 which is provided below the entire surface of the gate pad 33 similarly to the third embodiment. Since the gate electrode 10 is configured by the above structures, the switching noise can be more reduced similarly to the second embodiment and the third embodiment.

In addition, this embodiment can be combined with the fourth embodiment. In other words, the p type semiconductor region 7 may be provided on the first portion P1. Since the semiconductor device 500 includes the p type semiconductor region 7, the recovery capability of the semiconductor device can be further improved.

Figure 22:
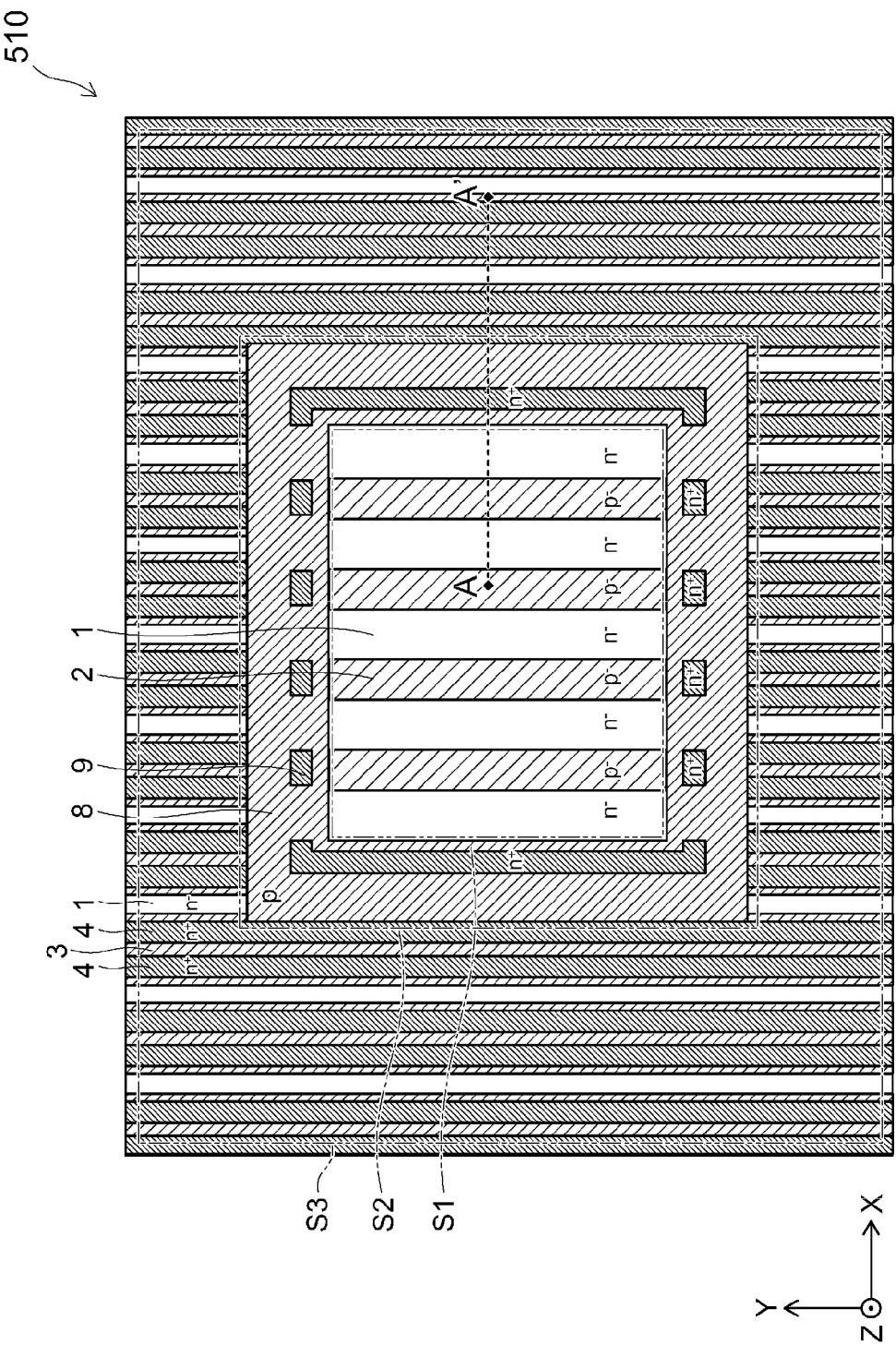
FIG. 22 is a plan view illustrating a part of a semiconductor device according to a modification of the fifth embodiment.

Alternatively, the $n^+$ type semiconductor region 9 may be selectively provided on the p type semiconductor region 8 as illustrated in FIG. 22.

FIG. 22 is a plan view illustrating a part of a semiconductor device 510 according to a modification of the fifth embodiment.

In FIG. 22, the gate electrode 10, the gate insulating portion 15, the insulating portion 20, the source electrode 32, and the gate pad 33 are omitted.

In the semiconductor device 510, a plurality of $n^+$ type semiconductor regions 9 are provided on the p type semiconductor region 8. The plurality of $n^+$ type semiconductor regions 9 are arranged circumferentially around the first portion P1. In addition, each of the $n^+$ type semiconductor regions 9 is located on the $p^-$ type pillar region 2.

With such a structure, the operation of the parasitic transistor can be suppressed still more compared to the semiconductor device 500.

A relative magnitude of the impurity concentration between the respective semiconductor regions in the respective embodiments described above can be confirmed using a SCM (a scanning capacitance microscope) for example. Further, a carrier concentration in each semiconductor region can be considered as being equal to the concentration of the impurities which are activated in the semiconductor region. Therefore, a relative magnitude of the carrier concentration between the respective semiconductor regions can also be confirmed using the SCM.

In addition, the impurity concentrations in the respective semiconductor regions can be measured by a SIMS (a secondary ion mass spectrometry) for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the specific configurations of the respective elements such as the $n^-$ type semiconductor region 1, the $p^-$ type pillar region 2, the p type base region 3, the $n^+$ type source region 4, the $n^+$ type drain region 5, the n type semiconductor region 6, the p type semiconductor region 7, the p type semiconductor region 8, the $n^+$ type semiconductor region 9, the gate electrode 10, the gate insulating portion 15, the insulating portion 20, the drain electrode 31, the source electrode 32, and the gate pad 33 included in the embodiments may be appropriately selected from well-known techniques by a person skilled in the art. The accompanying claims and their equivalents are intended to cover such forms or modifications as would fall within the scope and spirit of the inventions. In addition, the above embodiments can be implemented in combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first conductivity type first semiconductor region including:
        a first portion, and
        a second portion adjacent to the first portion in a first direction;
    a second conductivity type second semiconductor region including:
        a third portion adjacent to the first portion in a second direction that intersects the first direction, and a fourth portion disposed adjacent to the second portion in the second direction;
a second conductivity type third semiconductor region on the second semiconductor region;
a first conductivity type fourth semiconductor region on the third semiconductor region;
a gate insulating portion on the first semiconductor region and on the third semiconductor region;
a gate electrode on the gate insulating portion and over the first semiconductor region and a portion of the third semiconductor region in a third direction orthogonal to the first and second directions;
a first electrode on, and electrically connected to, the fourth semiconductor region and spaced from the gate electrode; and
a second electrode over the first portion, the third portion, and the gate electrode, in the third direction and spaced from the first electrode in at least the first direction, wherein
the first electrode surrounds the second electrode within a plane orthogonal to the third direction.

2. The semiconductor device according to claim 1, wherein the gate electrode comprises:
a first electrode portion extending in the first direction, and
a second electrode portion extending in the second direction and intersecting the first electrode portion.

3. The semiconductor device according to claim 2, further comprising:
a second conductivity type fifth semiconductor region on the third portion, wherein
the fifth semiconductor region is spaced from the third semiconductor region in the first direction.

4. The semiconductor device according to claim 1, wherein a portion of the first electrode is spaced from the gate electrode by a first insulating portion, and
the gate electrode includes:
a third electrode portion extending below the portion of the first electrode spaced from the gate electrode by the first insulating portion in the second direction, and
a fourth electrode portion below the second electrode, and
the length of the fourth electrode portion in the second direction is longer than that of the third electrode portion in the second direction.

5. The semiconductor device according to claim 1, further comprising:
a first conductivity type sixth semiconductor region on the first portion, wherein
a carrier concentration of the first conductivity type in the sixth semiconductor region is higher than that of the first conductivity type in the first semiconductor region.

6. The semiconductor device according to claim 1, further comprising:
a second conductivity type seventh semiconductor region in which a carrier concentration of the second conductivity type is higher than that of the second semiconductor region, wherein
the seventh semiconductor region extends between the first portion and the gate insulating portion.

7. A semiconductor device, comprising:
a first conductivity type first semiconductor region;
a plurality of second conductivity type second semiconductor regions extending inwardly of the first semiconductor region, the second semiconductor regions spaced from one another in a first direction, extend in a second direction that intersects the first direction, and extend inwardly of the first semiconductor region in a third direction that intersects the first and second directions, the first semiconductor region including a first sub portion, and a plurality of second sub-portions extending between adjacent second semiconductor regions;
a first electrode overlying a portion of the first and second semiconductor regions;
a second electrode overlying a portion of the first and second semiconductor regions and spaced from, and extending around, the first electrode;
a second conductivity type third semiconductor region on the second semiconductor region, wherein the second electrode overlies the second semiconductor region;
a fourth semiconductor region of the first conductivity type on the third semiconductor region; and
a third electrode extending in the second direction and between a second sub-portion and the first electrode and a second sub-portion and the second electrode.

8. The semiconductor device according to claim 7, wherein the portion of the third electrode underlying the first electrode further comprises:
a portion wider in the second direction to extend therefrom in the first direction between a plurality of second sub-portions and the first electrode.

9. The semiconductor device according to claim 7, further comprising:
a plurality of third electrodes each extending in the second direction and between a second sub-portion and the first electrode and a second sub-portion and the second electrode.

10. The device according to claim 7, wherein the third semiconductor regions extend inwardly of a portion of the second sub-portions in the first direction.

11. The semiconductor device according to claim 10, further comprising:
a first conductivity type fifth semiconductor region below the second electrode between the second sub-portion and a portion of the third electrode.

12. The semiconductor device according to claim 7, further comprising:
a plurality of second conductivity type sixth semiconductor regions extending in the second direction and spaced apart in the first direction, and extending from below a first portion and a second portion of the second electrode inwardly of the region below the first electrode and over a portion of the second semiconductor regions below the first electrode.

13. The device according to claim 7, further comprising:
a second conductivity type seventh semiconductor region extending between the space between the first electrode and the second electrode and an underlying second sub-portion.

14. A semiconductor device, comprising:
a semiconductor layer having a first surface and an opposed, second surface, including:
a first conductivity type first semiconductor region extending in a first direction and between the first surface and the second surface,
second conductivity type second and third semiconductor regions extending in the first direction and inwardly of the first surface and spaced apart in a second direction perpendicular to the first direction by a portion of the first semiconductor region therebetween, the third semiconductor regions extending between the second semiconductor regions and the first surface, and first conductivity type fourth semiconductor regions selectively located on the third semiconductor region at the first surface; and a first electrode overlying a first portion of the first and third semiconductor regions;

a second electrode overlying a second portion of the first and third semiconductor regions and spaced from opposed ends of the first electrode; and a third electrode extending over a portion of the first and third semiconductor regions and located between the first and third semiconductor regions and the first and second electrodes, wherein the fourth semiconductor region of the first conductivity type selectively located on the third second semiconductor region in the second portion thereof.

15. The device according to claim 14, further comprising:
a fourth electrode on the second surface of the semiconductor layer in electrical contact with the first semiconductor region, wherein a first capacitance is present between the first semiconductor region and the third electrode in the first portion;

a second capacitance is present between the third semiconductor region and the third electrode in the first portion;

a third capacitance is present between the first semiconductor region and the second semiconductor region in the first portion;

a fourth capacitance is present between the first semiconductor region and the third electrode in the first portion;

a fifth capacitance is present between the third semiconductor region and the third electrode in the first portion;

a sixth capacitance is present between the first semiconductor region and the second semiconductor region in the first portion;

when a voltage equal to or more than a threshold value is applied to the third electrode and a positive voltage is applied to the second electrode, the device is in an on state; and when a voltage less than the threshold value is applied to the third electrode, the device transitions to an off state, and the third and fourth capacitances fall as the voltage on the fourth electrode increases, wherein the third capacitance exceeds the first capacitance for a period of time after the voltage on the fourth electrode begins increasing.

16. The device according to claim 15, wherein the third and fourth capacitances achieve a steady state value as the device transitions from the on state to the off state, and the steady state value of the first capacitance is greater than the steady state value of the third capacitance.

17. The device according to claim 16, further comprising:
a first conductivity type fourth region interposed between the first semiconductor region and the third electrode at the first surface, wherein the impurity concentration of the first conductivity type impurity is greater in the fourth semiconductor region than in the first semiconductor region.

18. The device according to claim 16, wherein the impurity concentration of the second conductivity type impurity is greater in the third semiconductor region than in the second semiconductor region.

* * * * *